(12) United States Patent
Kadoi et al.

(10) Patent No.: US 8,810,317 B2
(45) Date of Patent: Aug. 19, 2014

(54) HIGH FREQUENCY CIRCUIT AND HIGH FREQUENCY MODULE

(75) Inventors: Ryo Kadoi, Fujisawa (JP); Norio Hayashi, Kanagawa (JP); Satoshi Shimizu, Kanagawa (JP); Akio Yamamoto, Hiratsuka (JP)

(73) Assignee: Renesas Electronics Corporation, Kanagawa (JP)

( * ) Notice: Subject to any disclaimer, the term of this patent is extended or adjusted under 35 U.S.C. 154(b) by 78 days.

(21) Appl. No.: 13/547,431

(22) Filed: Jul. 12, 2012

(65) Prior Publication Data

US 2013/0033327 A1 Feb. 7, 2013

(30) Foreign Application Priority Data

Aug. 5, 2011 (JP) ................. 2011-171642

(51) Int. Cl.
H03G 3/30 (2006.01)
(52) U.S. Cl.
USPC .......................................... 330/285; 330/296
(58) Field of Classification Search
USPC ................... 330/285, 296, 289, 267, 273
See application file for complete search history.

(56) References Cited

U.S. PATENT DOCUMENTS 7,304,539 B2 12/2007 Tsurumaki et al.
7,944,309 B2 * 5/2011 Cao ............................... 330/296

FOREIGN PATENT DOCUMENTS

JP 2005-123861 A 5/2005
JP 2010-263405 A 11/2010

* cited by examiner

*Primary Examiner* — Hieu Nguyen
(74) *Attorney, Agent, or Firm* — Mattingly & Malur, PC

(57) ABSTRACT

A high frequency circuit and a high frequency module are provided, in which the accuracy of compensation operation is improved in compensating by digital control. The amplification gain of an amplification element of an amplifier unit is controlled by a bias current of a bias control unit. A process monitoring circuit of a calibration circuit includes a first and a second element characteristic detector and a voltage comparator. The detectors convert the current of replica elements into a first and a second detection voltage. The voltage comparator compares a first and a second detection voltage and supplies a comparison output signal to a search control unit. Responding to the comparison output signal of the comparator and a clock signal of a clock generating unit, the controller generates a multi-bit digital compensation value according to a predetermined search algorithm, and the bias control unit of the second detector is feedback-controlled.

20 Claims, 11 Drawing Sheets

HIGH FREQUENCY CIRCUIT AND HIGH FREQUENCY MODULE

CROSS-REFERENCE TO RELATED APPLICATIONS

The disclosure of Japanese Patent Application No. 2011-171642 filed on Aug. 5, 2011 including the specification, drawings and abstract is incorporated herein by reference in its entirety.

BACKGROUND

The present invention relates to a high frequency circuit and a high frequency module incorporating the same, and especially relates to technology which is effective for improving the accuracy of compensation operation when compensating, through digital control, variations of the amplification characteristic of a high-frequency power amplification transistor employed in a high-frequency power amplifier circuit, due to variations in a semiconductor manufacturing process.

From the past, a MOS transistor and a bipolar transistor have been employed for a power amplification transistor of an RF power amplifier mounted in a transmitter of wireless communication terminals, such as a mobile-phone. In order to improve the amplification characteristic of a power amplification transistor, it is effective to reduce the channel length of a MOS transistor and the base width of a bipolar transistor.

However, the channel length of a MOS transistor and the base width of a bipolar transistor vary due to variations of the semiconductor manufacturing process, etc. of the MOS transistor and the bipolar transistor. Consequently, when the channel length L of a MOS transistor varies, channel conductance β of the MOS transistor varies, or when the base width Wb of a bipolar transistor varies, an effective base width varies by the Early effect and a collector current changes; accordingly, it is likely that the stability of a high-frequency power amplification characteristic will be impaired.

Patent Literature 1 cited below discloses a high-frequency power amplifier circuit includes an amplification transistor, a current simulation transistor, and a bias generating circuit, in which the bias generating circuit supplies the amplification transistor and the current simulation transistor with a bias for suppressing changes due to the short channel effect or the Early effect, by comparing a voltage generated on the basis of a current which flows through the current simulation transistor, with a reference voltage generated by converting a current of a constant current circuit with a current-to-voltage conversion element.

Patent Literature 2 cited below discloses an amplifier includes a bias unit, an amplifier unit, a current detecting element, a reference current generating unit, and a current comparator unit. The bias unit includes a reference transistor and a replica amplification transistor. A first bias current of the reference transistor and a second bias current of the replica amplification transistor are supplied to the current detecting element. The current detecting element generates a detection current corresponding to a difference between the first bias current and the second bias current. The current comparator unit controls the second bias current of the replica amplification transistor so that the detection current of the current detecting element coincides with the reference current of the reference current generating unit.

(Patent Literature 1) Japanese Patent Laid-open No. 2005-123861
(Patent Literature 2) Japanese Patent Laid-open No. 2010-263405

SUMMARY

The present inventors were engaged in research and development of a high-frequency amplifier which possesses resistance to variations in the semiconductor manufacturing process, in advance of the present invention.

In the research and development, the present inventors studied the technology disclosed by Patent Literature 1 and the technology disclosed by Patent Literature 2, as the related art. The examination by the present inventors has clarified that the two technologies have the following issues: that is, in the two technologies, a circuit error of a high-frequency amplifier due to variations of a semiconductor manufacturing process is detected and compensated by configuring a feedback loop of an analog system; consequently, the power consumption of operating the analog circuit is large.

On the other hand, the present inventors examined, in advance of the present invention, a high-frequency power amplifier circuit which includes a gate length monitoring circuit provided with an amplifier replicating transistor in a semiconductor chip. A bias field effect transistor and a power amplification field effect transistor are coupled so as to configure a current mirror, and a bias current generated by a bias control circuit is supplied to the bias field effect transistor. The gate length monitoring circuit generates a detection voltage depending on the gate length, and the bias control circuit controls the value of the bias current according to the detection voltage; accordingly, the gate length dependence of the trans conductance of the power amplification field effect transistor is compensated. When explained in detail, the analog detection voltage of the gate length monitoring circuit is converted into a digital signal by an A/D converter, and responding to the digital signal, the bias control circuit controls the value of the bias current in an open loop. When explained in further detail, the digital signal converted by the A/D converter is supplied to a conversion table, and bias digital information is generated from the conversion table and supplied to the bias control circuit. Consequently, in the present third technology, the bias control circuit controls the value of the bias current in terms of a digital signal; therefore, it is possible to reduce the power consumption of operating the analog circuit, which has been pointed out as a drawback of the two technologies described above.

In advance of the present invention, the present inventors have examined the third technology in detail and reached the following conclusions. That is, in the third technology, the gate length dependence of the transconductance is compensated by the bias control circuit controlling the value of the bias current in an open loop in terms of the digital signal; therefore, there is a possibility that the compensation operation becomes under or over. The reason exists not only in the fact that the detection voltage of the gate length monitoring circuit is dependent on the gate length, but in the fact that parameters, such as a gate oxide layer thickness and a channel mobility, change depending on the semiconductor manufacturing process. This is the reason that has been clarified by the examination performed by the present inventors in advance of the present invention. Therefore, in order to solve this issue, it is necessary to change the conversion table corresponding to the change of the semiconductor manufacture process parameters, etc. That is, even if the semiconductor manufacture process parameters change, the bias digital information which is generated by the conversion table in response to the digital signal from the A/D converter is appropriately changed by changing the conversion table. Accordingly, it is possible to make the compensation operation moderate.

Furthermore in the third technology, when the conversion table is incorporated not in a high-frequency power module, but in an RFIC (radio frequency semiconductor integrated circuit), it is necessary to couple a control logic circuit to the A/D converter and the bias control circuit in the high-frequency power module. Furthermore, it is necessary to transfer the digital signal from the A/D converter and the bias digital information from the conversion table, between the control logic circuit of the high-frequency power module and the conversion table of the RFIC. It is also necessary to supply an operation clock to the control logic circuit of the high-frequency power module from the RFIC. This is the fact that has been clarified by the examination performed by the present inventors in advance of the present invention.

The present invention has been made as the result of the above-described examination which has been performed by the present inventors in advance of the present invention.

Therefore, the purpose of the present invention is to improve the accuracy of the compensation operation, when compensating, by digital control, a variation of the amplification characteristic of a high-frequency power amplification transistor in a high-frequency power amplifier circuit, due to variations of the semiconductor manufacturing process.

Another purpose of the present invention is to provide a high-frequency power module which does not require a transfer of a digital signal and digital information related to the compensation operation, between the high-frequency power module and an external RFIC, and which does not require supply of an operation clock from the exterior.

Yet another purpose of the present invention is to reduce the power consumption of a calibration circuit for compensating the variation of the amplification characteristic of a high-frequency power amplification transistor.

The above and other purposes and new features of the present invention will become clear from the description of the present specification and the accompanying drawings.

The following explains briefly typical inventions to be disclosed by the present application.

That is, a high frequency circuit (1) according to a typical embodiment of the present invention comprises a high-frequency power amplifier circuit (20) having an amplifier unit (21) and a bias control unit (22); a process monitoring circuit (100); a search control unit (104); and a clock generating unit (105).

The amplification gain of an amplification transistor (212) of the amplifier unit (21) is controlled by a bias current of the amplification transistor (212) set up by the bias control unit (22).

The process monitoring circuit (100) includes a first element characteristic detector (101), a second element characteristic detector (102), and a voltage comparator (103).

A first replica transistor (1015) of the first element characteristic detector (101), a second replica transistor (1025) of the second element characteristic detector (102), and the amplification transistor (212) of the amplifier unit (21) are formed by the same semiconductor manufacturing process.

The first element characteristic detector (101) converts a first output current of the first replica transistor (1015) into a first detection voltage ($V_{OUT1}$).

The second element characteristic detector (102) converts a second output current of the second replica transistor (1025) into a second detection voltage ($V_{OUT2}$).

The voltage comparator (103) compares the first detection voltage ($V_{OUT1}$) with the second detection voltage ($V_{OUT2}$) and supplies the comparison output signal to the search control unit (104).

In response to a clock signal generated by the clock generating unit (105) and to the comparison output signal of the voltage comparator (103), the search control unit (104) generates a multi-bit digital error compensation value for minimizing a difference between the first detection voltage ($V_{OUT1}$) and the second detection voltage ($V_{OUT2}$) according to a predetermined search algorithm.

The second element characteristic detector (102) and the bias control unit (22) are feedback-controlled, in response to the digital error compensation value finally stored in the search control unit (104) according to the predetermined search algorithm (refer to FIG. 2).

The following explains briefly an effect obtained by the typical inventions to be disclosed in the present application.

That is, according to the present invention, it is possible to improve the accuracy of the compensation operation, when compensating, by digital control, a variation of the amplification characteristic of a high-frequency power amplification transistor in a high-frequency power amplifier circuit, due to variations of the semiconductor manufacturing process.

DETAILED DESCRIPTION

1. Outline of Embodiments

Figure 1:
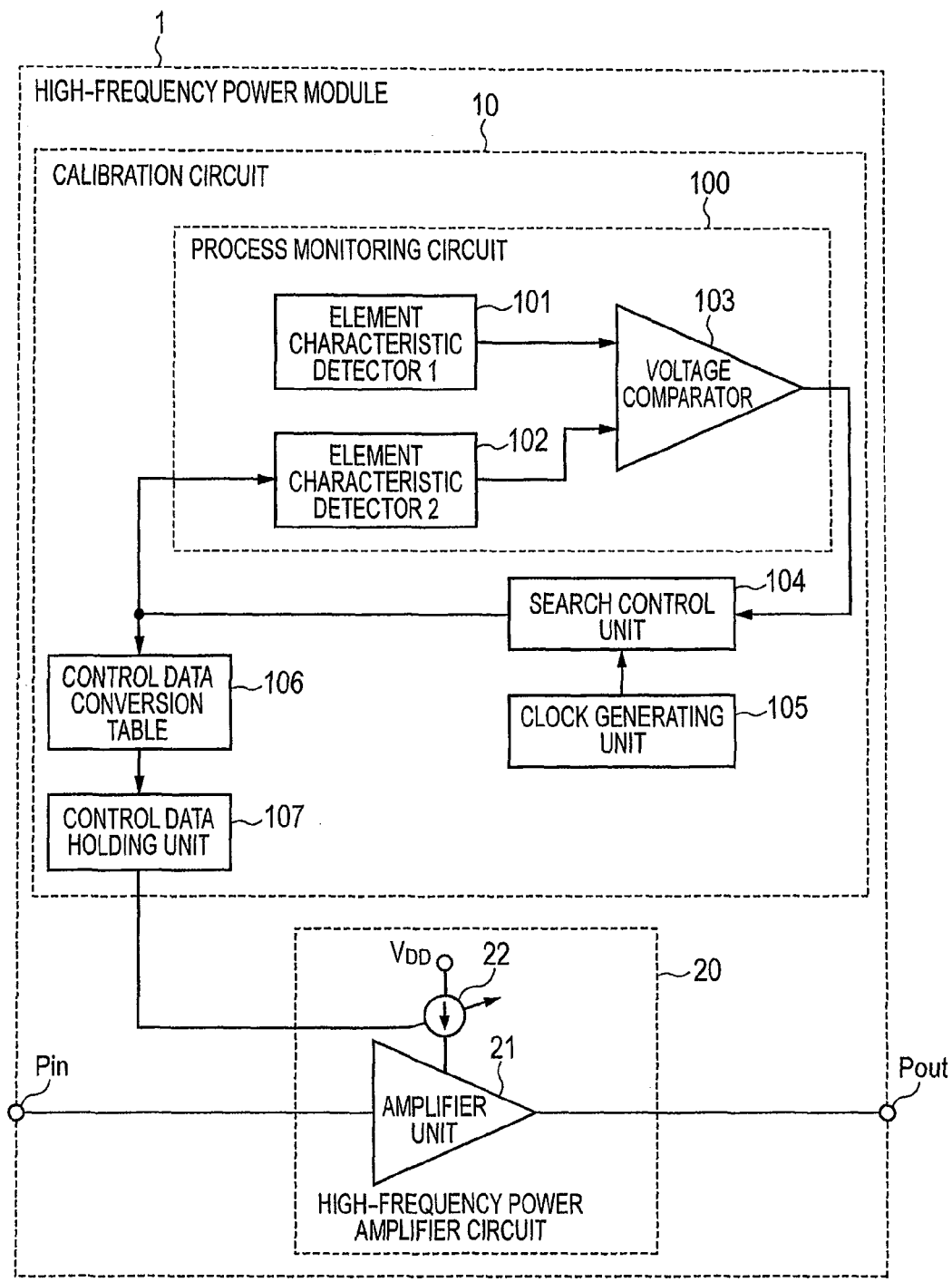
FIG. 1 is a drawing illustrating a fundamental configuration of a high-frequency power module 1 according to Embodiment 1 of the present invention.

First, an outline of a typical embodiment of the invention disclosed in the present application is explained. A numerical symbol of the drawing referred to in parentheses in the outline explanation about the typical embodiment only illustrates what is included in the concept of the component to which the numerical symbol is attached.

(1) A high frequency circuit (1) according to a typical embodiment of the present invention comprises a high-frequency power amplifier circuit (20) which has an amplifier unit (21) and a bias control unit (22); a process monitoring circuit (100); a search control unit (104); and a clock generating unit (105).

The amplification gain of an amplification transistor (212) of the amplifier unit (21) is controlled by a bias current of the amplification transistor (212) set up by the bias control unit (22).

The process monitoring circuit (100) includes a first element characteristic detector (101), a second element characteristic detector (102), and a voltage comparator (103).

A first replica transistor (1015) of the first element characteristic detector (101), a second replica transistor (1025) of the second element characteristic detector (102), and the amplification transistor (212) of the amplifier unit (21) are formed by the same semiconductor manufacturing process.

The first element characteristic detector (101) converts a first output current of the first replica transistor (1015) into a first detection voltage ($V_{OUT1}$).

The second element characteristic detector (102) converts a second output current of the second replica transistor (1025) into a second detection voltage ($V_{OUT2}$).

The voltage comparator (103) compares the first detection voltage ($V_{OUT1}$) with the second detection voltage ($V_{OUT2}$), and supplies the comparison output signal to the search control unit (104).

In response to a clock signal generated by the clock generating unit (105) and to the comparison output signal of the voltage comparator (103), the search control unit (104) generates a multi-bit digital error compensation value for minimizing a difference between the first detection voltage ($V_{OUT1}$) and the second detection voltage ($V_{OUT2}$) according to a predetermined search algorithm.

Figure 2:
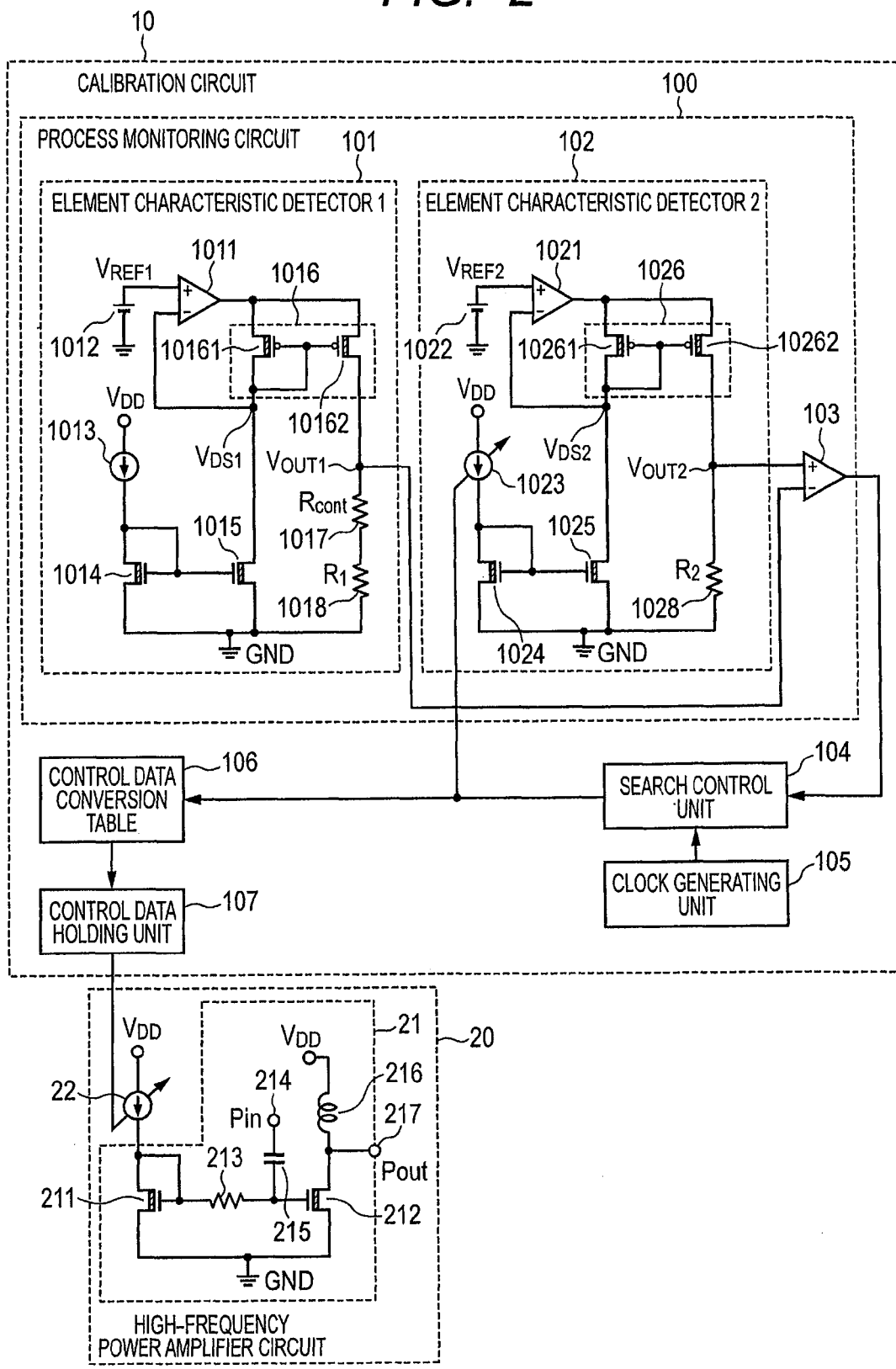
FIG. 2 is a drawing illustrating a configuration of a first element characteristic detector 101 and a second element characteristic detector 102 of a process monitoring circuit 100 and a configuration of an amplifier unit 21, in the high-frequency power module 1, according to Embodiment 1 of the present invention illustrated in FIG. 1.

The second element characteristic detector (102) and the bias control unit (22) are feedback-controlled, in response to the digital error compensation value finally stored in the search control unit (104) according to the predetermined search algorithm (refer to FIG. 2).

According to Embodiment 1, it is possible to improve the accuracy of compensation operation when compensating, by digital control, a variation of the amplification characteristic of the high-frequency power amplification transistor of the high-frequency power amplifier circuit, due to variations of the semiconductor manufacturing process.

According to a preferred embodiment, in ideal conditions where variations of the semiconductor manufacturing process for forming the high-frequency power amplifier circuit (20) can be substantially ignored, the first detection voltage ($V_{OUT1}$) of the first element characteristic detector (101) and the second detection voltage ($V_{OUT2}$) of the second element characteristic detector (102) are set at a substantially equal voltage level (refer to FIG. 2).

According to another preferred embodiment, in the ideal conditions, the second output current of the second replica transistor (1025) is set to be larger than the first output current of the first replica transistor (1015).

The first element characteristic detector (101) includes a first current-to-voltage conversion resistor (1017, 1018) for converting the first output current of the first replica transistor (1015) into the first detection voltage ($V_{OUT1}$), and the second element characteristic detector (102) includes a second current-to-voltage conversion resistor (1028) for converting the second output current of the second replica transistor (1025) into the second detection voltage ($V_{OUT2}$).

The first current-to-voltage conversion resistor (1017, 1018) is set to be larger than the second current-to-voltage conversion resistor (1028), in order to set the first detection voltage ($V_{OUT1}$) and the second detection voltage ($V_{OUT2}$) to be at a substantially equal voltage level in the ideal conditions (refer to FIG. 2).

According to yet another preferred embodiment, the first element characteristic detector (101) includes a first bias transistor (1014) coupled to the first replica transistor (1015) so as to configure a current mirror, and a first current source (1013) for passing a first current through the first bias transistor (1014).

The second element characteristic detector (102) includes a second bias transistor (1024) coupled to the second replica transistor (1025) so as to configure a current mirror, and a second current source (1023) for passing a second current through the second bias transistor (1024).

The amplifier unit (21) includes a third bias transistor (211) coupled to the amplification transistor (212) so as to configure a current mirror.

A third current flowing through the third bias transistor (211) of the amplifier unit (21) is set up by the bias control unit (22) configured as a third current source.

The value of the second current flowing through the second current source (1023) of the second element characteristic detector (102) and the value of the third current flowing through the third current source (22) of the amplifier unit (21) are controlled, in response to the digital error compensation value finally stored in the search control unit (104) (refer to FIG. 2).

In a more preferred embodiment, the first element characteristic detector (101) includes a first reference voltage source (1012); a first operational amplifier (1011); and a first current mirror transistor pair (1016) comprised of a first input P-channel MOS FET (10161) and a first output P-channel MOS FET (10162).

The second element characteristic detector (102) includes a second reference voltage source (1022); a second operational amplifier (1021); and a second current mirror transistor pair (1026) comprised of a second input P-channel MOS FET (10261) and a second output P-channel MOS FET (10262).

The first reference voltage ($V_{REF1}$) of the first reference voltage source (1012) is supplied to a noninverting input terminal of the first operational amplifier (1011). An output terminal of the first operational amplifier (1011) is coupled to a source of the first input P-channel MOS FET (10161) and a source of the first output P-channel MOS FET (10162) of the first current mirror transistor pair (1016).

A gate of the first input P-channel MOS FET (10161) and a gate of the first output P-channel MOS FET (10162) are coupled with each other. The gate of the first input P-channel MOS FET (10161) is coupled to a drain of the first input P-channel MOS FET (10161), an output electrode of the first replica transistor (1015), and an inverting input terminal of the first operational amplifier (1011).

A drain of the first output P-channel MOS FET (10162) is coupled to the first current-to-voltage conversion resistor (1017, 1018) and one input terminal of the voltage comparator (103).

A second reference voltage ($V_{REF2}$) of the second reference voltage source (1022) is supplied to a noninverting input terminal of the second operational amplifier (1021). An output terminal of the second operational amplifier (1021) is coupled to a source of the second input P-channel MOS FET (10261) and a source of the second output P-channel MOS FET (10262) of the second current mirror transistor pair (1026).

A gate of the second input P-channel MOS FET (10261) and a gate of the second output P-channel MOS FET (10262) are coupled with each other. The gate of the second input P-channel MOS FET (10261) is coupled to a drain of the second input P-channel MOS FET (10261), an output electrode of the second replica transistor (1025), and an inverting input terminal of the second operational amplifier (1021).

The drain of the second output P-channel MOS FET (10262) is coupled to the second current-to-voltage conversion resistor (1028) and the other input terminal of the voltage comparator (103).

The second reference voltage ($V_{REF2}$) of the second reference voltage source (1022) is set to be larger than the first reference voltage ($V_{REF1}$) of the first reference voltage source (1012) (refer to FIG. 2).

In another more preferred embodiment, the first replica transistor (1015), the second replica transistor (1025), the amplification transistor (212), the first bias transistor (1014), the second bias transistor (1024), and the third bias transistor (211) are N-channel MOS FETs each formed by the same semiconductor manufacturing process (refer to FIG. 2).

Figure 14:
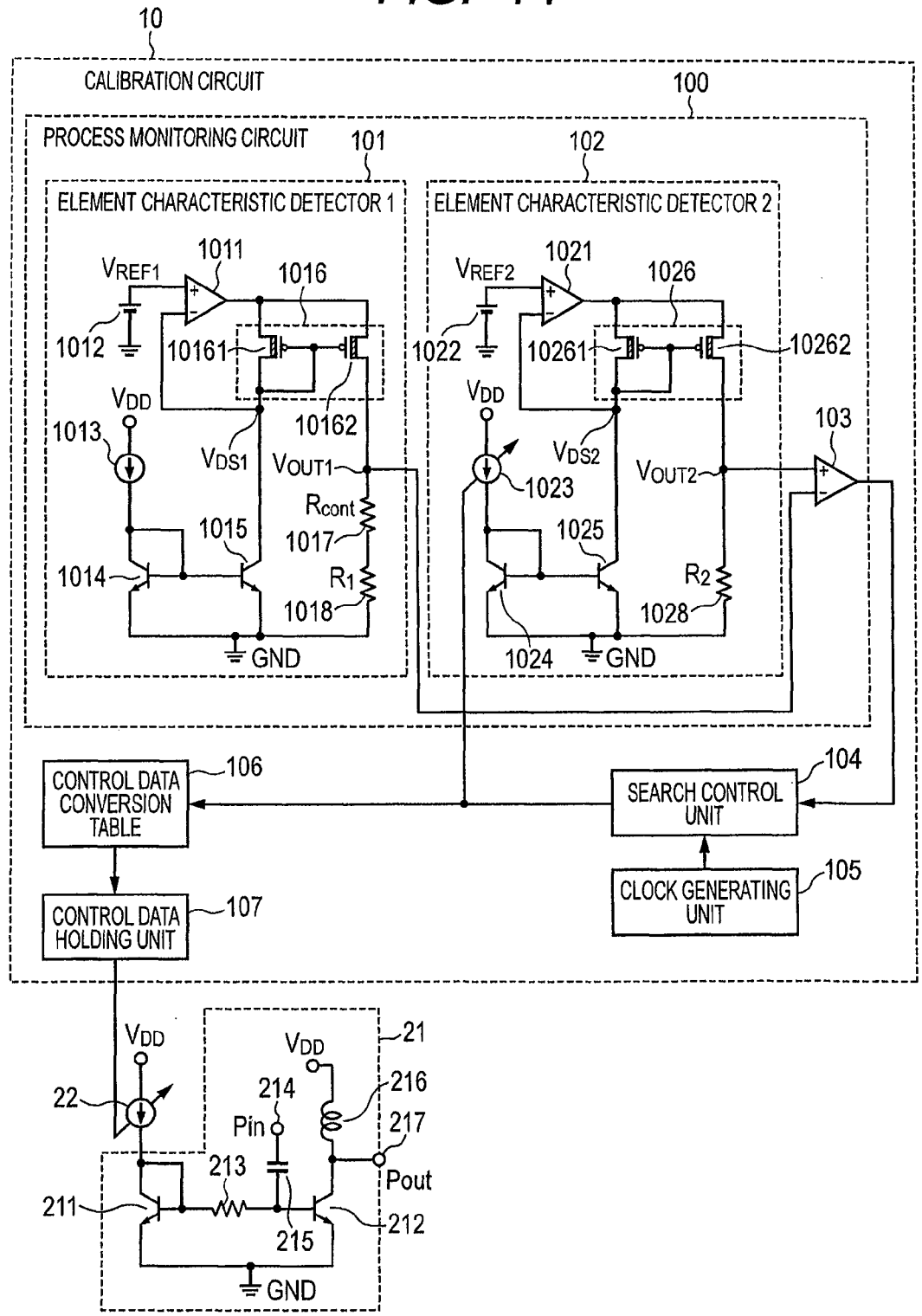
FIG. 14 is a drawing illustrating a configuration of a first element characteristic detector 101 and a second element characteristic detector 102 of a process monitoring circuit 100 of a calibration circuit 10 and a configuration of an amplifier unit 21, according to Embodiment 3 of the present invention.

In further another more preferred embodiment, the first replica transistor (1015), the second replica transistor (1025), the amplification transistor (212), the first bias transistor (1014), the second bias transistor (1024), and the third bias transistor (211) are bipolar transistors each formed by the same semiconductor manufacturing process (refer to FIG. 14).

In a yet another more preferred embodiment, the first replica transistor (1015), the second replica transistor (1025), the amplification transistor (212), the first bias transistor (1014), the second bias transistor (1024), and the third bias transistor (211) are heterojunction bipolar transistors each formed in a compound semiconductor chip by the same semiconductor manufacturing process.

Figure 10:
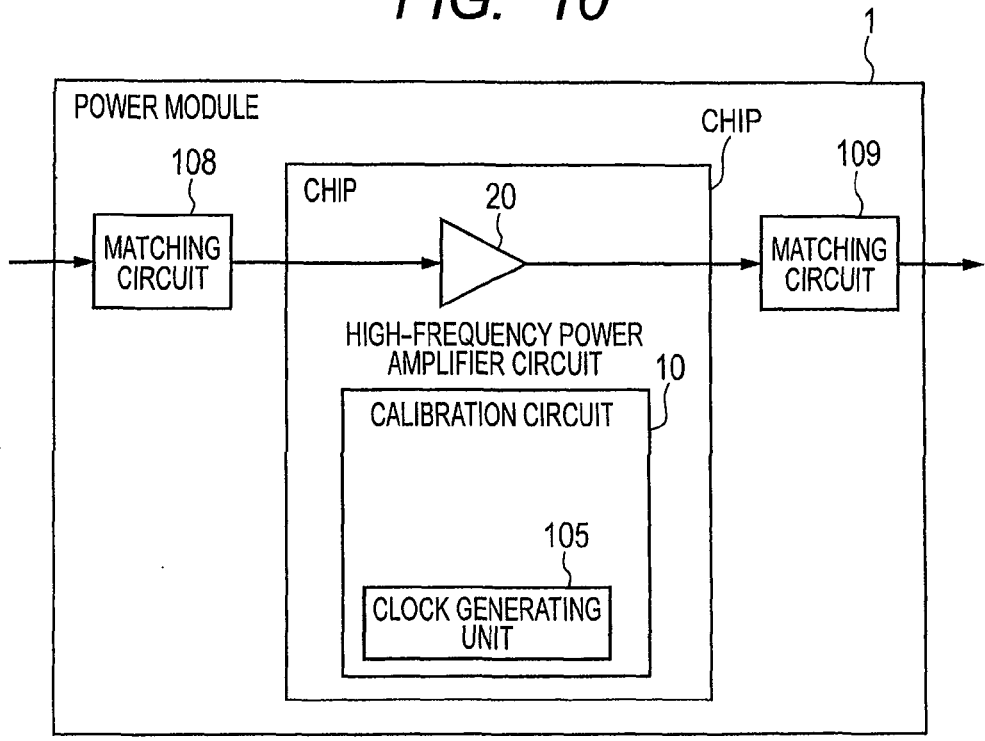
FIG. 10 is a drawing illustrating a manner in which the clock generating unit 105 is formed in a CMOS silicon semiconductor chip "Chip" with a high-frequency power amplifier circuit 20 and the calibration circuit 10, the clock generating unit 105 comprised of a ring oscillator of three-stage series-coupled CMOS inverters Inv1, Inv2, and Inv3, according to Embodiment 1 of the present invention illustrated in FIG. 9.

In a further yet another more preferred embodiment, the high-frequency power amplifier circuit (20), the process monitoring circuit (100), the search control unit (104), and the clock generating unit (105) are formed in a single semiconductor chip (Chip) (refer to FIG. 10).

Figure 11:
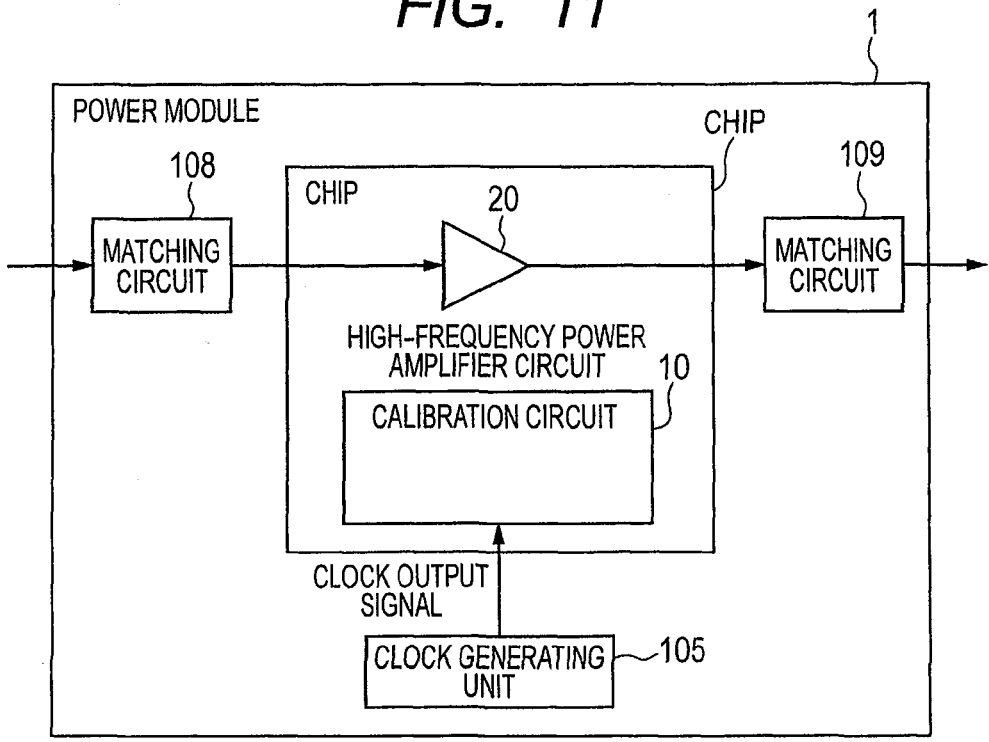
FIG. 11 is a drawing illustrating another example of a high-frequency power module 1 according to Embodiment 1 of the present invention, in which a clock generating unit 105 comprised of a crystal oscillator, a CMOS silicon semiconductor chip "Chip", an input matching circuit 108, and an output matching circuit 109 are mounted in a common module.

In a specific embodiment, the high-frequency power amplifier circuit (20), the process monitoring circuit (100), the search control unit (104), and the clock generating unit (105) are mounted in a common high-frequency power module (1), and the high-frequency power amplifier circuit (20), the process monitoring circuit (100), and the search control unit (104) are formed in a single semiconductor chip (refer to FIG. 11).

In another specific embodiment, the high frequency circuit (1) further comprises a control circuit (110); a power supply circuit (111); and a control data holding unit (107).

The control circuit (110) and the power supply circuit (111) are supplied with an external power supply voltage ($V_{DD}$).

The control circuit (110) supplies a control start signal (Pon_Reset) to the power supply circuit (111).

In response to the control start signal (Pon_Reset), the power supply circuit (111) supplies a calibration power supply voltage ($V_{DD}$_CAL) to the first element characteristic detector (101), the second element characteristic detector (102), and the voltage comparator (103) of the process monitoring circuit (100), and to the search control unit (104) and the clock generating unit (105).

The first element characteristic detector (101), the second element characteristic detector (102), and the voltage comparator (103) of the process monitoring circuit (100), and the search control unit (104) and the clock generating unit (105) execute calibration operation with the use of the calibration power supply voltage ($V_{DD}$_CAL), and accordingly the digital error compensation value is stored finally in the search control unit (104) according to the predetermined search algorithm, At the timing when the digital error compensation value is finally stored in the search control unit (104), and the execution of the calibration operation completes, the search control unit (104) supplies a control end signal (CAL_End) to the power supply circuit (111).

In response to the control end signal (CAL_End), the power supply circuit (111) supplies a high-frequency amplification power supply voltage ($V_{DD}$_RF) to the amplifier unit (21) and the bias control unit (22).

The amplifier unit (21) and the bias control unit (22) execute high-frequency amplifying operation using the high-frequency amplification power supply voltage ($V_{DD}$_RF). In the period of the high-frequency amplifying operation, the calibration power supply voltage ($V_{DD}$_CAL), which is supplied to the first element characteristic detector (101), the second element characteristic detector (102), and the voltage comparator (103) of the process monitoring circuit (100), and to the search control unit (104) and the clock generating unit (105), is set at a low voltage (refer to FIG. 12 and FIG. 13).

Figure 12:
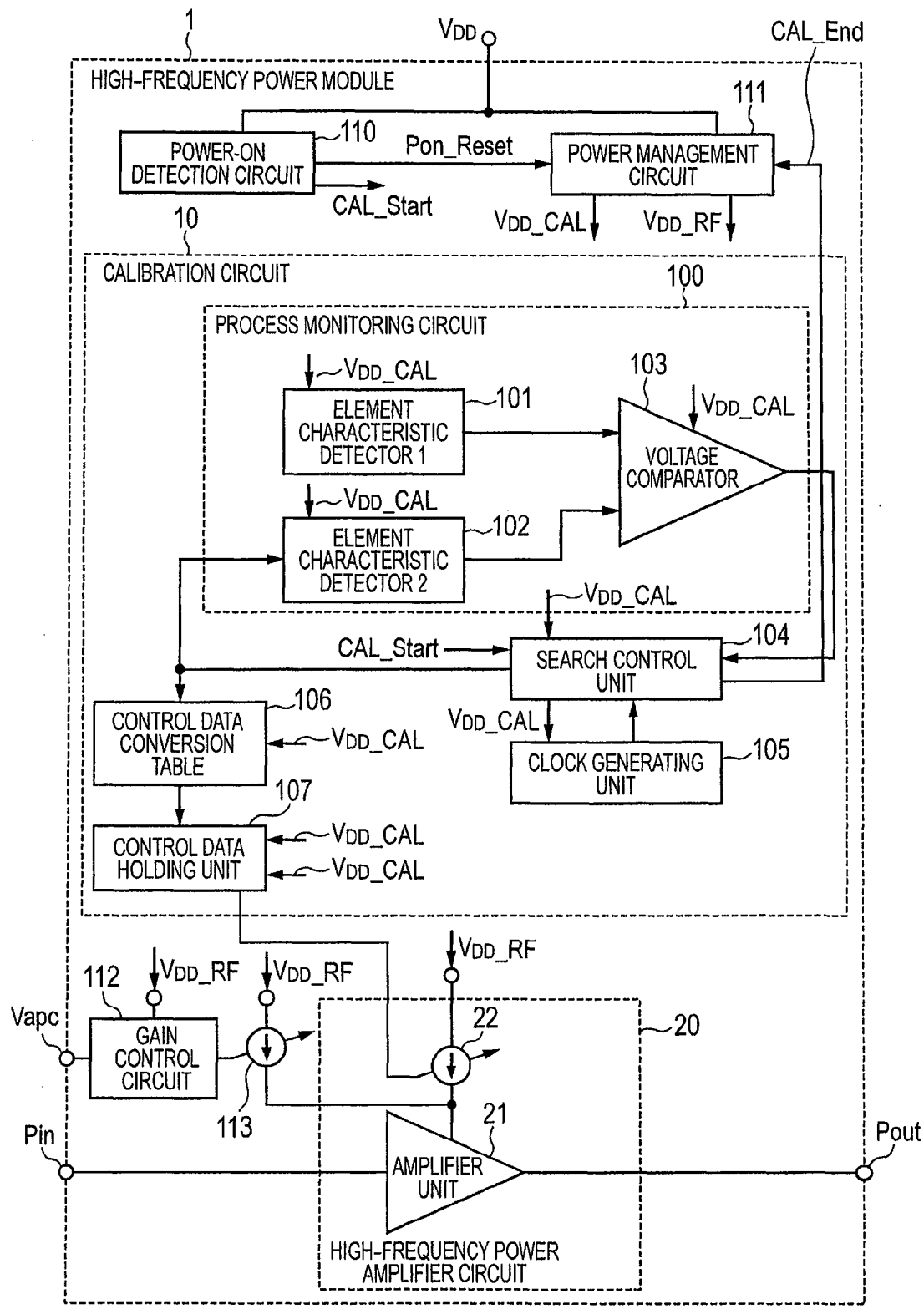
FIG. 12 is a drawing illustrating a configuration of a high-frequency power module 1 according to Embodiment 2 of the present invention.
Figure 13:
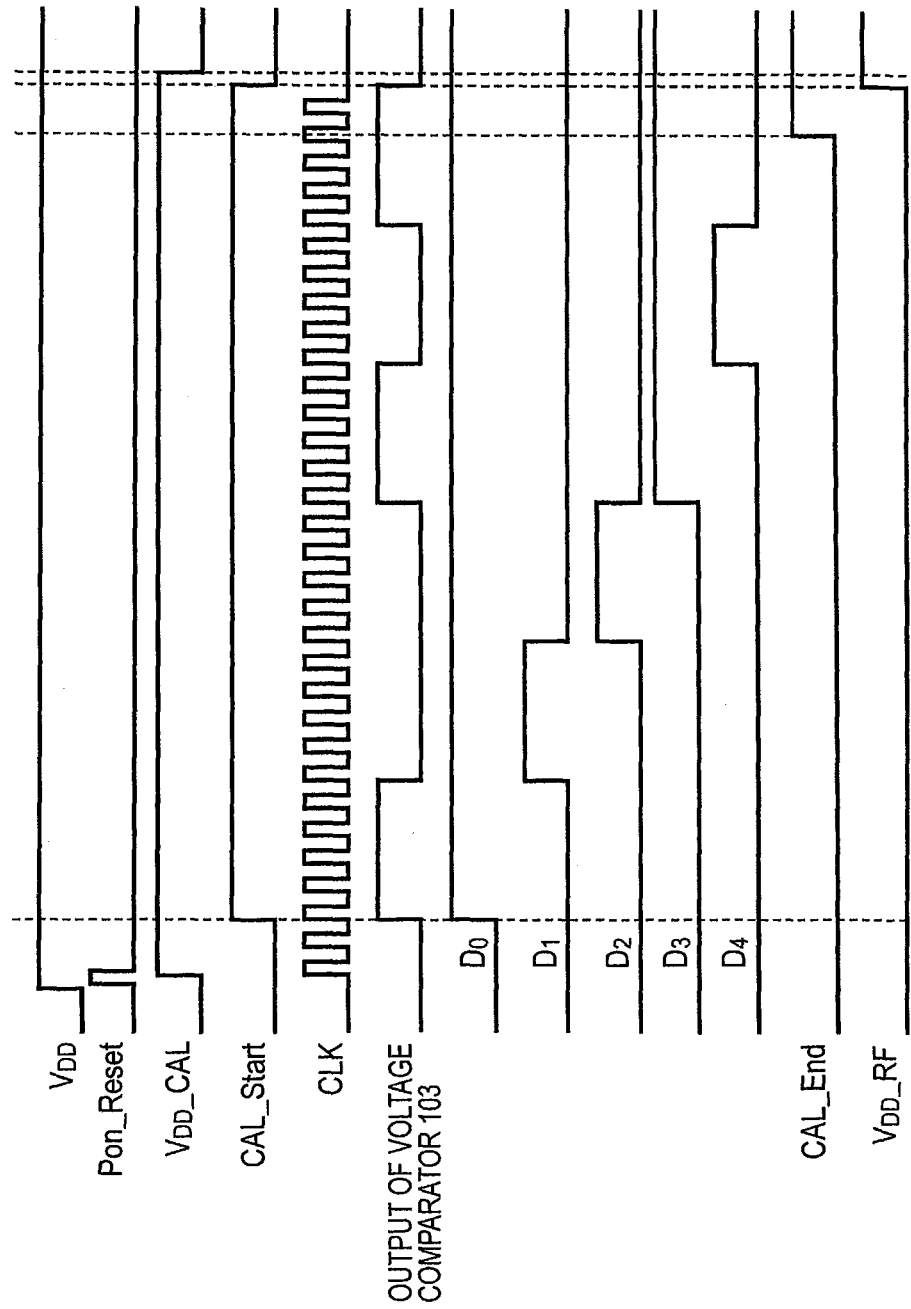
FIG. 13 is a waveform chart illustrating operation of the high-frequency power module 1, according to Embodiment 2 of the present invention illustrated in FIG. 12.

In more specific embodiment, in the period of the calibration operation, the high-frequency amplification power supply voltage ($V_{DD}$_RF) supplied to the amplifier unit (21) and the bias control unit (22) is set at a low voltage (refer to FIG. 12 and FIG. 13).

In another more specific embodiment, the control circuit (110) is configured as a power-on detection circuit which can detect power-on of the external power supply voltage ($V_{DD}$).

The control circuit (110) configured as the power-on detection circuit supplies the control start signal (Pon_Reset) as a power-on reset signal to the power supply circuit (111).

At the timing when the oscillating frequency of the clock signal generated by the clock generating unit (105) is stabilized substantially after the start of supplying the calibration power supply voltage ($V_{DD}$_CAL) to the clock generating unit (105), the control circuit (110) configured as the power-on detection circuit supplies a calibration start signal (CAL_Start) to the search control unit (104) (refer to FIG. 12 and FIG. 13).

In the most specific embodiment, the high frequency circuit (1) further comprises a gain control circuit (112); and a gain-control-oriented variable current source (113).

The gain control circuit (112) controls the gain-control-oriented variable current source (113) so that the gain-control-oriented variable current substantially proportional to an automatic power control voltage (Vapc) flows through the gain-control-oriented variable current source (113).

The gain-control-oriented variable current flowing through the gain-control-oriented variable current source (113) is supplied to the amplifier unit (21).

The power supply circuit (111) supplies the high-frequency amplification power supply voltage ($V_{DD}$_RF) to the gain control circuit (112) and the gain-control-oriented variable current source (113), in the period of the high-frequency amplifying operation (refer to FIG. 12).

(2) A high frequency module (1) according to a typical embodiment of another viewpoint of the present invention comprises a high-frequency power amplifier circuit (20); a process monitoring circuit (100); a search control unit (104); and a clock generating unit (105).

The high-frequency power amplifier circuit (20) includes an amplifier unit (21) and a bias control unit (22). The amplification gain of an amplification transistor (212) of the amplifier unit (21) is controlled by a bias current of the amplification transistor (212) set up by the bias control unit (22).

The process monitoring circuit (100) includes a replica transistor (1015, 1025) formed by the same semiconductor manufacturing process as the amplification transistor (212) of the amplifier unit (21), and accordingly the process monitoring circuit (100) generates a monitor output monitoring the characteristics of the replica transistor (1015, 1025).

In response to a calibration clock signal of the clock generating unit (105) and to the monitor output of the process monitoring circuit (100), the search control unit (104) generates a multi-bit digital compensation value for tuning up the amplification gain of the amplification transistor (212) according to a predetermined search algorithm.

The process monitoring circuit (100) and the bias control unit (22) are feedback-controlled, in response to the digital compensation value stored in the search control unit (104) according to the predetermined search algorithm (refer to FIG. 2).

According to the embodiment, it is possible to improve the accuracy of compensation operation when compensating, by digital control, a variation of the amplification characteristic of the high-frequency power amplification transistor of the high-frequency power amplifier circuit, due to variations of the semiconductor manufacturing process.

In a preferred embodiment, the amplification transistor (212) of the amplifier unit (21) and the replica transistor (1015, 1025) of the process monitoring circuit (100) are N-channel MOS FETs formed by the same semiconductor manufacturing process (refer to FIG. 2).

In another preferred embodiment, the amplification transistor (212) of the amplifier unit (21) and the replica transistor (1015, 1025) of the process monitoring circuit (100) are bipolar transistors formed by the same semiconductor manufacturing process (refer to FIG. 14).

In a more preferred embodiment, the high-frequency power amplifier circuit (20), the process monitoring circuit (100), the search control unit (104), and the clock generating unit (105) are formed in a single semiconductor chip (Chip), and a calibration circuit (10) is comprised of the process monitoring circuit (100), the search control unit (104), and the clock generating unit (105) (refer to FIG. 10).

In another more preferred embodiment, the high-frequency power amplifier circuit (20), the process monitoring circuit (100), and the search control unit (104) are formed in a single semiconductor chip (Chip), and a calibration circuit (10) to which a clock signal is supplied from the clock generating unit (105) is comprised of the process monitoring circuit (100) and the search control unit (104) (refer to FIG. 11).

In a specific embodiment, the high frequency module (1) further comprises a control circuit (110); a power supply circuit (111); and a control data holding unit (107).

The control circuit (110) and the power supply circuit (111) are supplied with an external power supply voltage ($V_{DD}$).

The control circuit (110) supplies a control start signal (Pon_Reset) to the power supply circuit (111).

In response to the control start signal (Pon_Reset), the power supply circuit (111) supplies a calibration power supply voltage ($V_{DD}$_CAL) to the process monitoring circuit (100), the search control unit (104), and the clock generating unit (105).

The process monitoring circuit (100), the search control unit (104), and the clock generating unit (105) execute calibration operation with the use of the calibration power supply voltage ($V_{DD}$_CAL), and accordingly the digital compensation value is stored in the search control unit (104) according to the predetermined search algorithm.

At the timing when the digital compensation value is finally stored in the search control unit (104), and the execution of the calibration operation completes, the search control unit (104) supplies a control end signal (CAL_End) to the power supply circuit (111).

In response to the control end signal (CAL_End), the power supply circuit (111) supplies a high-frequency amplification power supply voltage ($V_{DD}$_RF) to the amplifier unit (21) and the bias control unit (22).

The amplifier unit (21) and the bias control unit (22) execute high-frequency amplifying operation using the high-frequency amplification power supply voltage ($V_{DD}$_RF). In the period of the high-frequency amplifying operation, the calibration power supply voltage ($V_{DD}$_CAL), which is supplied to the process monitoring circuit (100), the search control unit (104), and the clock generating unit (105), is set at a low voltage (refer to FIG. 12 and FIG. 13).

2. Details of Embodiments

Next, the embodiments are explained in full detail. In the entire diagrams for explaining the embodiments of the present invention, the same symbol is attached to a component which possesses the same function, and the repeated explanation thereof is omitted.

Embodiment 1

A Fundamental Configuration of a High-Frequency Power Module

FIG. 1 illustrates a fundamental configuration of a high-frequency power module 1 according to Embodiment 1 of the present invention.

As illustrated in FIG. 1, the high-frequency power module 1 is comprised of a calibration circuit 10 and a high-frequency power amplifier circuit 20. The high-frequency power amplifier circuit 20 is comprised of an amplifier unit 21 and a bias control unit 22. The amplifier unit 21 performs power amplification of an RF input signal Pin at an RF input terminal, to generate an RF output signal Pout at an RF output terminal. The RF input signal Pin at the RF input terminal is supplied from a transmit signal processing unit of an RFIC (radio frequency semiconductor integrated circuit) (not shown). The RF output signal Pout at the RF output terminal is supplied to an antenna of a mobile-phone via an output matching circuit, an antenna switch, a duplexer, etc. (the antenna and the others are not shown). The amplification gain of the amplifier unit 21 can be controlled by a current value of a bias current of a power amplification transistor of the amplifier unit 21, set up by the bias control unit 22.

<<The Calibration Circuit>>

The calibration circuit 10 of the high-frequency power module 1 illustrated in FIG. 1 compensates a variation of the amplification characteristic of a power amplification transistor of the amplifier unit 21, caused by variations of the semiconductor manufacturing process.

The calibration circuit 10 is comprised of a process monitoring circuit 100, a search control unit 104, a clock generating unit 105, a control data conversion table 106, and a control data holding unit 107. The process monitoring circuit 100 monitors a variation of the amplification characteristic of the power amplification transistor of the amplifier unit 21, caused by variations of the semiconductor manufacturing process. That is, the process monitoring circuit 100 is comprised of a first element characteristic detector 101, a second element characteristic detector 102, and a voltage comparator 103. A first detecting transistor of the first element characteristic detector 101, a second detecting transistor of the second element characteristic detector 102, and a power amplification transistor of the amplifier unit 21 are formed by the same semiconductor manufacturing process. A gate width Wg of these transistors has the same manufacture target size, and a gate length Lg of these transistors also has the same manufacture target size. When these transistors are bipolar transistors, these transistors are formed by the same semiconductor manufacturing process, and a base width Wb of these transistors also has the same manufacture target size.

In a zero state where the variations of the semiconductor manufacturing process are in an ideal state, a first detected output signal of the first element characteristic detector 101 and a second detected output signal of the second element characteristic detector 102 becomes equal. Therefore, a digital error compensation value of the search control unit 104, in which a multi-bit comparison output signal of the voltage comparator 103 is stored in response to a clock signal generated by the clock generating unit 105, also becomes in the zero state. Therefore, in the ideal conditions, even if the second element characteristic detector 102 of the process monitoring circuit 100, and the amplifier unit 21 and the bias control unit 22 of the high-frequency power amplifier circuit 20 are feedback-controlled, in response to the digital error compensation value of the search control unit 104, a bias state becomes equivalent to the state at the time of not compensating a variation of the amplification characteristic of the power amplification transistor of the amplifier unit 21, caused by variations of the semiconductor manufacturing process.

However, variations of the semiconductor manufacturing process occur actually, and the first detected output signal of the first element characteristic detector 101 and the second detected output signal of the second element characteristic detector 102 are different. Accordingly, the comparison output signal of the voltage comparator 103 changes to a high level or a low level, depending on the magnitude relation of the first detected output signal and the second detected output signal. In response to the clock signal generated by the clock generating unit 105, the search control unit 104 generates a digital error compensation value according to an appropriate search algorithm, such as a binary search, so that the difference between the first detected output signal of the first element characteristic detector 101 and the second detected output signal of the second element characteristic detector 102 may become minimum. That is, the second element characteristic detector 102 of the process monitoring circuit 100, and the amplifier unit 21 and the bias control unit 22 of the high-frequency power amplifier circuit 20 are feedback-controlled, according to the digital error compensation value finally stored in the search control unit 104 by the search operation. Therefore, the feedback control is executed so as to realize the substantially ideal conditions in which the difference between the first detected output signal of the first element characteristic detector 101 and the second detected output signal of the second element characteristic detector 102 of the process monitoring circuit 100 attains the minimum. According to the ideal digital error compensation value stored in the search control unit 104, the amplifier unit 21 and the bias control unit 22 of the high-frequency power amplifier circuit 20 perform the digital feedback-controlled compensation of the amplification characteristic of the power amplification transistor against variations of the semiconductor manufacturing process.

Specifically, the digital error compensation value stored in the search control unit 104 is converted into bias current setting information by the control data conversion table 106. The bias current setting information is used when the bias control unit 22 of the high-frequency power amplifier circuit 20 sets up the current value of the bias current of the power amplification transistor of the amplifier unit 21. The bias current setting information converted by the control data conversion table 106 is stored in the control data holding unit 107, and supplied to the bias control unit 22 from the control data holding unit 107.

<<A Configuration of the Process Monitoring Circuit and the Amplifier Unit>>

FIG. 2 illustrates a configuration of the first element characteristic detector 101 and the second element characteristic detector 102 of the process monitoring circuit 100 and a configuration of the amplifier unit 21, in the high-frequency power module 1, according to Embodiment 1 of the present invention illustrated in FIG. 1.

As illustrated in FIG. 2, the first element characteristic detector 101 includes a fixed current source 1013, a replica transistor 1015, a bias transistor 1014, a current mirror transistor pair 1016, a reference voltage source 1012, an operational amplifier 1011, a current-to-voltage conversion resistor 1018, and a comparison voltage adjusting resistor 1017.

Since the bias transistor 1014 of an N-channel MOS FET and the replica transistor 1015 of an N-channel MOS FET are coupled in a current mirror configuration, the constant current of a current value proportional to the constant current of the fixed current source 1013 which flows through the bias transistor 1014 serving as an input transistor of the current mirror flows through the replica transistor 1015 serving as an output transistor of the current mirror. A source of the bias transistor 1014 and a source of the replica transistor 1015 are coupled to a ground voltage GND, a gate and a drain of the bias transistor 1014 are coupled, the gate of the bias transistor 1014 and a gate of the replica transistor 1015 are coupled, and the fixed current source 1013 is coupled between the drain of the bias transistor 1014 and a power supply voltage $V_{DD}$.

A reference voltage $V_{REF1}$ of the reference voltage source 1012 is supplied to a noninverting input terminal of the operational amplifier 1011. An output terminal of the operational amplifier 1011 is coupled to sources of two P-channel MOS FETs 10161 and 10162 of the current mirror transistor pair 1016. A gate and a drain of the P-channel MOS FET 10161 are coupled to a gate of the P-channel MOS FET 10162, and further coupled to an inverting input terminal of the operational amplifier 1011 and a drain of the replica transistor 1015. A drain of the P-channel MOS FET 10162 is coupled to the ground voltage GND via the comparison voltage adjusting resistor 1017 and the current-to-voltage conversion resistor 1018 which are coupled in series, and further coupled to an inverting input terminal of the voltage comparator 103.

As illustrated in FIG. 2, the second element characteristic detector 102 includes a variable current source 1023, a replica transistor 1025, a bias transistor 1024, a current mirror transistor pair 1026, a reference voltage source 1022, an operational amplifier 1021, and a current-to-voltage conversion resistor 1028.

Since the bias transistor 1024 of an N-channel MOS FET and the replica transistor 1025 of an N-channel MOS FET are coupled in a current mirror configuration, the constant current of a current value proportional to the variable constant current of the variable current source 1023 which flows through the bias transistor 1024 serving as an input transistor of the current mirror flows through the replica transistor 1025 serving as an output transistor of the current mirror. A source of the bias transistor 1024 and a source of the replica transistor 1025 are coupled to the ground voltage GND, a gate and a drain of the bias transistor 1024 are coupled, the gate of the bias transistor 1024 and a gate of the replica transistor 1025 are coupled, and the variable current source 1023 is coupled between the drain of the bias transistor 1024 and the power supply voltage $V_{DD}$.

A reference voltage $V_{REF2}$ of the reference voltage source 1022 is supplied to a noninverting input terminal of the operational amplifier 1021. An output terminal of the operational amplifier 1021 is coupled to sources of two P-channel MOS FETs 10261 and 10262 of the current mirror transistor pair 1026. A gate and a drain of the P-channel MOS FET 10261 are coupled with a gate of the P-channel MOS FET 10262, and further coupled to an inverting input terminal of the operational amplifier 1021 and a drain of the replica transistor 1025. A drain of the P-channel MOS FET 10262 is coupled to the ground voltage GND via the current-to-voltage conversion resistor 1028, and further coupled to a noninverting input terminal of the voltage comparator 103.

As illustrated in FIG. 2, the amplifier unit 21 includes a bias transistor 211, an RF signal input terminal 214, a DC-cut capacitor 215, an AC-component attenuation resistor 213, an amplification transistor 212, a load element 216, and an RF signal output terminal 217.

Since the bias transistor 211 of an N-channel MOS FET and the amplification transistor 212 of an N-channel MOS FET are coupled in a current mirror configuration, the constant current of a current value proportional to the variable constant current of the bias control unit 22 which flows through the bias transistor 211 serving as an input transistor of the current mirror flows through the amplification transistor 212 serving as an output transistor of the current mirror. A source of the bias transistor 211 and a source of the amplification transistor 212 are coupled to the ground voltage GND, a gate and a drain of the bias transistor 211 are coupled, the gate of the bias transistor 211 and a gate of the amplification transistor 212 are coupled with each other via the AC-component attenuation resistor 213, and the variable current source of the bias control unit 22 is coupled between the drain of the bias transistor 211 and the power supply voltage $V_{DD}$.

In FIG. 2, the first detecting transistor 1015 of the first element characteristic detector 101, the second detecting transistor 1025 of the second element characteristic detector 102, and the power amplification transistor 212 of the amplifier unit 21 are formed by the same semiconductor manufacturing process. A gate width Wg of these transistors has the same manufacture target size, and a gate length Lg of these transistors has the same manufacture target size. The first bias transistor 1014 of the first element characteristic detector 101, the second bias transistor 1024 of the second element characteristic detector 102, and bias transistor 211 of the amplifier unit 21 are formed by the same semiconductor manufacturing process. A gate width Wg of these transistors has the same manufacture target size, and a gate length Lg of these transistors has the same manufacture target size.

By the feedback operation of the operational amplifier 1011, a drain-to-source voltage $V_{DS1}$ of the first detecting transistor 1015 coupled to the inverting input terminal is controlled to the substantially same voltage level as the reference voltage $V_{REF1}$ of the reference voltage source 1012 coupled to the noninverting input terminal. Similarly, by the feedback operation of the operational amplifier 1021, a drain-to-source voltage $V_{DS2}$ of the second detecting transistor 1025 coupled to the inverting input terminal is controlled to the substantially same voltage level as the reference voltage $V_{REF2}$ of the reference voltage source 1022 coupled to the noninverting input terminal.

In order to establish the relation of $I_{DS1} < I_{DS2}$ between a drain current $I_{DS1}$ of the first detecting transistor 1015 of the first element characteristic detector 101, and a drain current $I_{DS2}$ of the second detecting transistor 1025 of the second element characteristic detector 102, the relation of $V_{REF1} < V_{REF2}$ and the relation of $V_{DS1} < V_{DS2}$ are set up in advance.

Therefore, the drain current $I_{DS1}$ of the first detecting transistor 1015 of the first element characteristic detector 101 and the drain current $I_{DS2}$ of the second detecting transistor 1025 of the second element characteristic detector 102 are given by the following equations, respectively.

$$I_{DS1} = \frac{1}{2}\mu C_{OX} \frac{W_G}{L_G}(V_{GS} - V_{TH})^2(1 + \lambda V_{DS1})$$ (Equation 1)

$$I_{DS2} = \frac{1}{2}\mu C_{OX} \frac{W_G}{L_G}(V_{GS} - V_{TH})^2(1 + \lambda V_{DS2})$$ (Equation 2)

Here, μ is a channel mobility of a MOS FET, $C_{OX}$ is a gate oxide layer capacitance of the MOS FET, $V_{GS}$ is a gate-source voltage of the MOS FET, $V_{TH}$ is a threshold voltage of the MOS FET, and λ is a channel length modulation coefficient of the MOS FET.

By setting up the relation of $V_{DS1} < V_{DS2}$ in advance, it becomes possible to establish the relation of $I_{DS} < I_{DS2}$ between the drain currents $I_{DS1}$ and $I_{DS2}$ which are given by Equation (1) and Equation (2).

By designing identically the element size of two P-channel MOS FETs 10161 and 10162 of the current mirror transistor pair 1016 of the first element characteristic detector 101, it becomes possible to pass the current of the same current value as the drain current $I_{DS1}$ of the first detecting transistor 1015 of the first element characteristic detector 101, through the comparison voltage adjusting resistor 1017 and the current-to-voltage conversion resistor 1018 which are coupled in series. Similarly, by designing identically the element size of two P-channel MOS FETs 10261 and 10262 of the current mirror transistor pair 1026 of the second element characteristic detector 102, it becomes possible to pass the current of the same current value as the drain current $I_{DS2}$ of the second detecting transistor 1025 of the second element characteristic detector 102 through the current-to-voltage conversion resistor 1028.

Assuming that the value of resistance of the comparison voltage adjusting resistor 1017 is $R_{cont}$, the value of resistance of the current-to-voltage conversion resistor 1018 is $R_1$, and the value of resistance of the current-to-voltage conversion resistor 1028 is $R_2$, the first detection voltage $V_{OUT1}$ of the first element characteristic detector 101 and the second detection voltage $V_{OUT2}$ of the second element characteristic detector 102 are given by the following equations, respectively.

$$V_{OUT1} = (R_{cont} + R_1)I_{DS1}$$ (Equation 3)

$$V_{OUT2} = R_2 I_{DS2}$$ (Equation 4)

In a zero state where the variations of the semiconductor manufacturing process are in an ideal state, the value of resistance $R_{cont}$ of the comparison voltage adjusting resistor 1017 is set up so that the first detection voltage $V_{OUT1}$ of the first element characteristic detector 101 and the second detection voltage $V_{OUT2}$ of the second element characteristic detector 102 may become substantially equal to each other. By equating Equation (3) and Equation (4), the value of resistance $R_{cont}$ of the comparison voltage adjusting resistor 1017 is derived by the following equations.

$$(R_{cont} + R_1)I_{DS1} = R_2 I_{DS2}$$ (Equation 5)

$$R_{cont} = R_2 \frac{I_{DS2}}{I_{DS1}} - R_1$$ (Equation 6)

For example, when the value of resistance $R_1$ and the value of resistance $R_2$ are equal to a value of resistance R, and when the relation of $I_{DS2} = 2I_{DS1}$ holds for the drain currents $I_{DS1}$ and $I_{DS2}$, the value of resistance $R_{cont}$ of the comparison voltage adjusting resistor 1017 is given by the value of resistance R.

When the variations of the semiconductor manufacturing process are in an ideal state (a zero state), the first detection voltage $V_{OUT1}$ of the first element characteristic detector 101 and the second detection voltage $V_{OUT2}$ of the second element characteristic detector 102 become equal. Therefore, a digital error compensation value of the search control unit 104, in which a multi-bit comparison output signal of the voltage comparator 103 is stored in response to a clock signal generated by the clock generating unit 105, also becomes in the zero state. Therefore, in the ideal conditions, even if the second element characteristic detector 102 of the process monitoring circuit 100, and the amplifier unit 21 and the bias control unit 22 of the high-frequency power amplifier circuit 20 are feedback-controlled, in response to the digital error compensation value of the search control unit 104, the bias state becomes equivalent to the state at the time of not compensating a variation of the amplification characteristic of the power amplification transistor of the amplifier unit 21 caused by variations of the semiconductor manufacturing process.

However, variations of the semiconductor manufacturing process occurs actually, and the first detection voltage $V_{OUT1}$ of the first element characteristic detector 101 and the second detection voltage $V_{OUT2}$ of the second element characteristic detector 102 are different; accordingly, the comparison output signal of the voltage comparator 103 changes to a high level or a low level, depending on the magnitude relation of the first detection voltage $V_{OUT1}$ and the second detection voltage $V_{OUT2}$. In response to the clock signal generated by the clock generating unit 105, the search control unit 104 generates the digital error compensation value according to an appropriate search algorithm, such as a binary search, so that the difference between the first detection voltage $V_{OUT1}$ and the second detection voltage $V_{OUT2}$ may become minimum. That is, the second element characteristic detector 102 of the process monitoring circuit 100, and the amplifier unit 21 and the bias control unit 22 of the high-frequency power amplifier circuit 20 are feedback-controlled, according to the digital error compensation value finally stored in the search control unit 104 by the search operation. Therefore, the feedback control is executed so as to realize the substantially ideal conditions in which the difference between the first detection voltage $V_{OUT1}$ and the second detection voltage $V_{OUT2}$ of the process monitoring circuit 100 attains the minimum. According to the ideal digital error compensation value stored in the search control unit 104, the amplifier unit 21 and the bias control unit 22 of the high-frequency power amplifier circuit 20 perform the digital feedback-controlled compensation of the amplification characteristic of the power amplification transistor against variations of the semiconductor manufacturing process.

Specifically, the digital error compensation value stored in the search control unit 104 is converted into bias current setting information by the control data conversion table 106. The bias current setting information is used when the bias control unit 22 of the high-frequency power amplifier circuit 20 sets up the current value of the bias current of the power amplification transistor of the amplifier unit 21. The bias current setting information converted by the control data conversion table 106 is stored in the control data holding unit 107, and supplied to the bias control unit 22 from the control data holding unit 107.

<<Operation of the First Element Characteristic Detector and the Second Element Characteristic Detector>>

Figure 3:
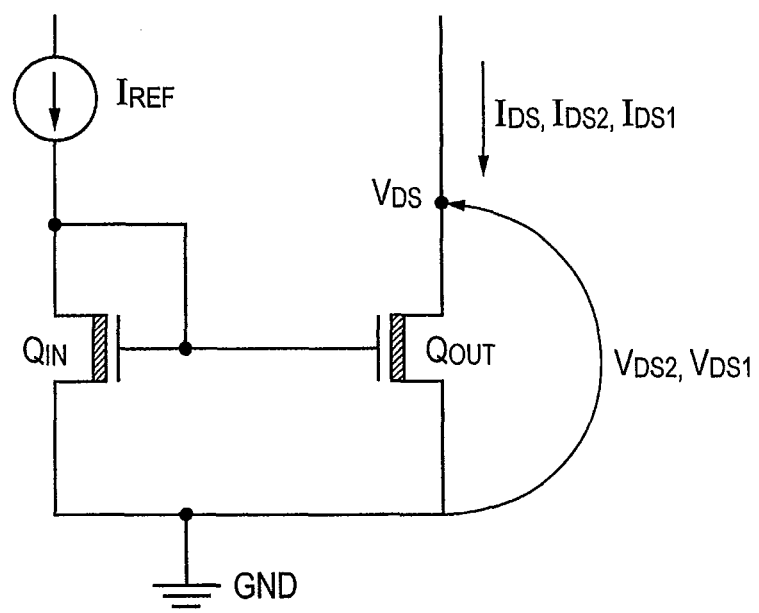
FIG. 3 is an explanatory drawing illustrating operation of bias transistors 1014 and 1024 and replica transistors 1015 and 1025 which are respectively coupled so as to configure a current mirror in the first element characteristic detector 101 and the second element characteristic detector 102, as illustrated in FIG. 2.

FIG. 3 is an explanatory drawing illustrating operation of the bias transistors 1014 and 1024 and the replica transistors 1015 and 1025 which are respectively coupled so as to configure a current mirror in the first element characteristic detector 101 and the second element characteristic detector 102, as illustrated in FIG. 2.

As illustrated in FIG. 3, an output current $I_D$ proportional to an input current $I_{REF}$ flowing through the bias transistor serving as an input transistor $Q_{IN}$ of the current mirror flows through the replica transistor serving as an output transistor $Q_{OUT}$ of the current mirror. When the values of the drain-to-source voltage $V_{DS}$ of the output transistor $Q_{OUT}$ are $V_{DS2}$ and $V_{DS1}$, the corresponding values $I_{DS2}$ and $I_{DS1}$ of the output current $I_D$ are given by Equation (2) and Equation (1), respectively.

Figure 4A:
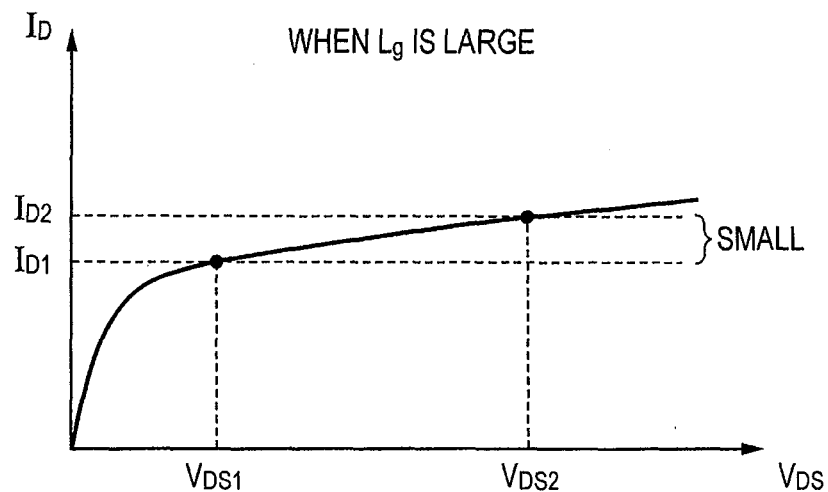
FIG. 4(A) and FIG. 4(B) are drawings illustrating a manner in which output currents $I_{D2}$ and $I_{D1}$ of an output transistor $Q_{OUT}$ of the current mirror explained in FIG. 3 change depending on the size of a gate length Lg of a MOS FET.
Figure 4B:
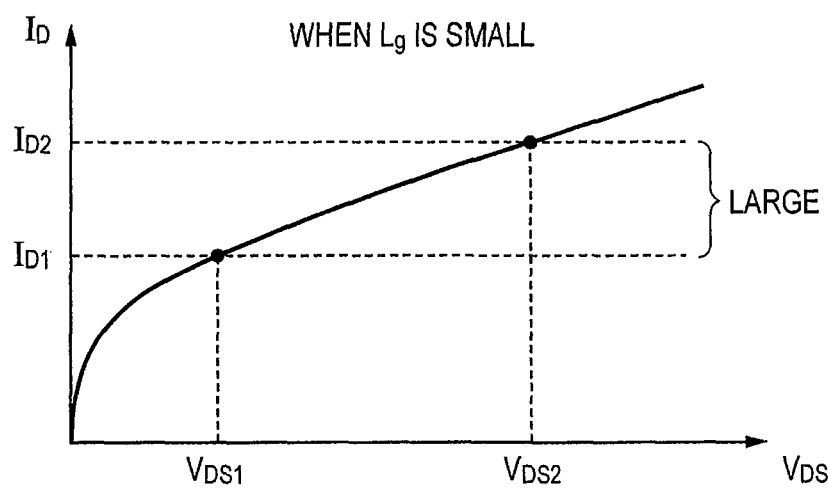

FIG. 4(A) and FIG. 4(B) illustrate a manner in which output currents $I_{DS2}$ and $I_{DS1}$ of the output transistor $Q_{OUT}$ of the current mirror explained in FIG. 3 change depending on the size of a gate length Lg of a MOS FET.

FIG. 4(A) illustrates the output currents $I_{DS2}$ and $I_{DS1}$ of the output transistor $Q_{OUT}$ of the current mirror when the gate length Lg of the MOS FET is large. When the gate length Lg is large, a channel length modulation coefficient λ of the MOS FET is small; accordingly, when the value of the drain-to-source voltage $V_{DS}$ of the output transistor $Q_{OUT}$ changes to $V_{DS2}$ from $V_{DS1}$, the difference of the corresponding output currents $I_{DS2}$ and $I_{DS1}$ of the output transistor $Q_{OUT}$ is small.

FIG. 4(B) illustrates the output currents $I_{DS2}$ and $I_{DS1}$ of the output transistor $Q_{OUT}$ of the current mirror when the gate length Lg of the MOS FET is small. When the gate length Lg is small, a channel length modulation coefficient λ of the MOS FET is large; accordingly, when the value of the drain-to-source voltage $V_{DS}$ of the output transistor $Q_{OUT}$ changes to $V_{DS2}$ from $V_{DS1}$, the difference of the corresponding output currents $I_{DS2}$ and $I_{DS1}$ of the output transistor QOUT is large.

Figure 5A:
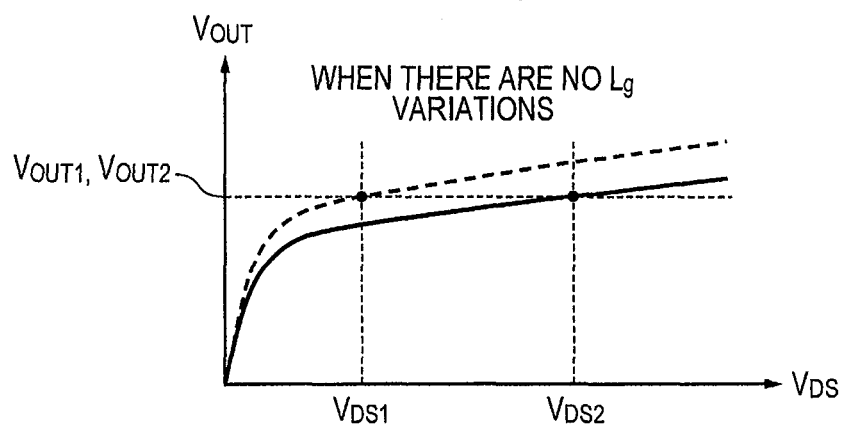
FIG. 5(A), FIG. 5(B), and FIG. 5(C) are drawings illustrating a manner in which the first detection voltage $V_{OUT1}$ of the first element characteristic detector 101 and the second detection voltage $V_{OUT2}$ of the second element characteristic detector 102 of the process monitoring circuit 100, according to Embodiment 1 of the present invention illustrated in FIG. 2, change depending on variations of the gate length Lg of the MOS FET.
Figure 5B:
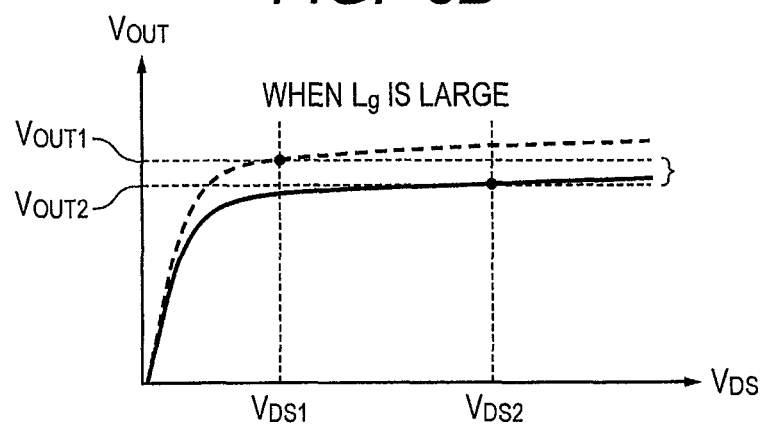
Figure 5C:
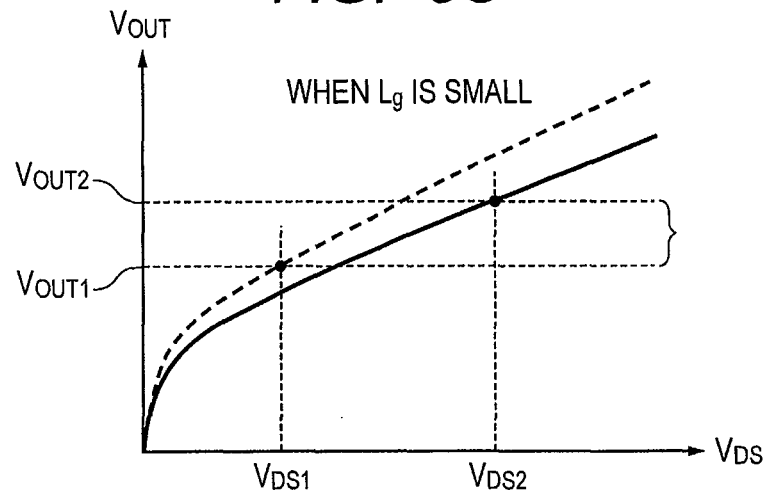

FIG. 5(A), FIG. 5(B), and FIG. 5(C) illustrate a manner in which the first detection voltage $V_{OUT1}$ of the first element characteristic detector 101 and the second detection voltage $V_{OUT2}$ of the second element characteristic detector 102 of the process monitoring circuit 100, according to Embodiment 1 of the present invention illustrated in FIG. 2, change depending on variations of the gate length Lg of the MOS FET.

FIG. 5(A) illustrates the case where there are no variations in gate length Lg when the variations of the semiconductor manufacturing process are in an ideal zero state. In the present case, as mentioned above, the value of the first detection voltage $V_{OUT1}$ of the first element characteristic detector 101 and the value of the second detection voltage $V_{OUT2}$ of the second element characteristic detector 102 in the process monitoring circuit 100 become equal substantially.

FIG. 5(B) illustrates the case where the gate length Lg is larger than the manufacture target size, as a consequence of occurrence of variations of the semiconductor manufacturing process. In the case of FIG. 5(B), the channel length modulation coefficient λ of the MOS FET is smaller than that in the case of FIG. 5(A); accordingly, in the process monitoring circuit 100, the value of the second detection voltage $V_{OUT2}$ of the second element characteristic detector 102 becomes smaller than the value of the first detection voltage $V_{OUT1}$ of the first element characteristic detector 101.

FIG. 5(C) illustrates the case where the gate length Lg is smaller than the manufacture target size, as a consequence of occurrence of variations of the semiconductor manufacturing process. In the case of FIG. 5(C), the channel length modulation coefficient λ of the MOS FET is larger than that in the case of FIG. 5(A); accordingly, in the process monitoring circuit 100, the value of the second detection voltage $V_{OUT2}$ of the second element characteristic detector 102 becomes larger than the value of the first detection voltage $V_{OUT1}$ of the first element characteristic detector 101.

On the other hand, a transconductance gm of a MOS FET is given by the following equation.

$$g_m = \sqrt{\mu C_{OX} \frac{W_G}{L_G}(1+\lambda V_{DS})I_{DS}} \qquad \text{(Equation 7)}$$

Therefore, it can be understood from Equation (7) that, when the gate length Lg becomes larger than the manufacture target size as a consequence of variations of the semiconductor manufacturing process, it is possible to compensate the dependence of the transconductance gm on the gate length Lg of the MOS FET, by increasing the drain current $I_{DS}$ from the initial value. Similarly, it can be understood from Equation (7) that, when the gate length Lg becomes smaller than the manufacture target size as a consequence of variations of the semiconductor manufacturing process, it is possible to compensate the dependence of the transconductance gm on the gate length Lg of the MOS FET, by decreasing the drain current $I_{DS}$ from the initial value.

On the other hand, the state where the gate length Lg is large and the relation of $V_{OUT2} < V_{OUT1}$ holds as illustrated in FIG. 5(B), and the state where the gate length Lg is small and the relation of $V_{OUT2} > V_{OUT1}$ holds as illustrated in FIG. 5(C) can be determined respectively by the low level and the high level of the comparison output signal of the voltage comparator 103.

That is, it is possible to determine the state where the gate length Lg is large and the relation of $V_{OUT2} < V_{OUT1}$ holds as in FIG. 5(B), on the basis of a low level of the comparison output signal of the voltage comparator 103. In response to the clock signal generated by the clock generating unit 105, the search control unit 104 generates a digital error compensation value which satisfies the relation of $V_{OUT2} \approx V_{OUT1}$, according to an appropriate search algorithm, such as a binary search, for example. That is, the digital error compensation value of the search control unit 104 is feedback-controlled to the ideal state in which the relation of $V_{OUT2} \approx V_{OUT1}$ is satisfied, by increasing the variable constant current of the variable current source 1023 rather than the initial value. The digital error compensation value stored in the search control unit 104 is converted into bias current setting information by the control data conversion table 106. The bias current setting information is stored in the control data holding unit 107, and supplied to the bias control unit 22 from the control data holding unit 107. The bias control unit 22 of the high-frequency power amplifier circuit 20 sets up the current value of the bias current of the power amplification transistor 212 of the amplifier unit 21. That is, by increasing the drain current $I_{DS}$ of the power amplification transistor 212 of the amplifier unit 21 rather than the initial value, it is possible to compensate the dependence of the transconductance gm on the gate length Lg of the MOS FET of the power amplification transistor 212.

Similarly, it is possible to determine the state where the gate length Lg is small and the relation of $V_{OUT2} > V_{OUT1}$ holds as in FIG. 5(C), on the basis of a high level of the comparison output signal of the voltage comparator 103. In response to the clock signal generated by the clock generating unit 105, the search control unit 104 generates a digital error compensation value which satisfies the relation of $V_{OUT2} \approx V_{OUT1}$, according to an appropriate search algorithm, such as a binary search, for example. That is, the digital error compensation value of the search control unit 104 is feedback-controlled to the ideal state in which the relation of $V_{OUT2} \approx V_{OUT1}$ is satisfied, by decreasing the variable constant current of the variable current source 1023 rather than the initial value. The digital error compensation value stored in the search control unit 104 is converted into bias current setting information by the control data conversion table 106. The bias current setting information is stored in the control data holding unit 107, and supplied to the bias control unit 22 from the control data holding unit 107. The bias control unit 22 of the high-frequency power amplifier circuit 20 sets up the current value of the bias current of the power amplification transistor 212 of the amplifier unit 21. That is, by decreasing the drain current $I_{DS}$ of the power amplification transistor 212 of the amplifier unit 21 rather than the initial value, it is possible to compensate the dependence of the transconductance gm on the gate length Lg of the MOS FET of the power amplification transistor 212.

Figure 6:
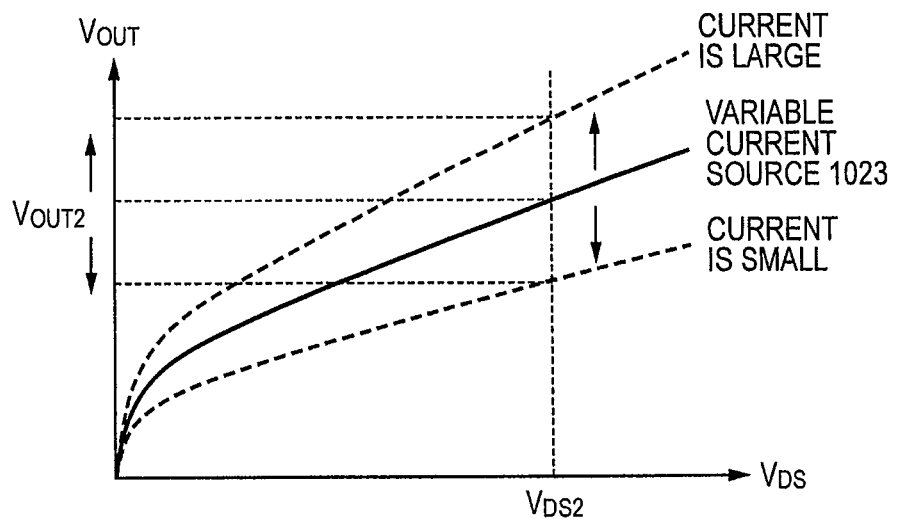
FIG. 6 is a drawing illustrating that the second detection voltage $V_{OUT2}$ of the second element characteristic detector 102 of the process monitoring circuit 100, according to Embodiment 1 of the present invention illustrated in FIG. 2, can be controlled by a variable constant current of a variable current source 1023.

FIG. 6 is a drawing illustrating that the second detection voltage $V_{OUT2}$ of the second element characteristic detector 102 of the process monitoring circuit 100, according to Embodiment 1 of the present invention illustrated in FIG. 2, can be controlled by a variable constant current of the variable current source 1023.

As illustrated in FIG. 6, the second detection voltage $V_{OUT2}$ of the second element characteristic detector 102 increases by increasing the variable constant current of the variable current source 1023, and the second detection voltage $V_{OUT2}$ of the second element characteristic detector 102 decreases by decreasing the variable constant current of the variable current source 1023. That is, the value of the variable constant current of the variable current source 1023 is set up so that the first detection voltage $V_{OUT1}$ of the first element characteristic detector 101 and the second detection voltage $V_{OUT2}$ of the second element characteristic detector 102 may become equal substantially.

<<A Configuration of the Bias Control Unit and the Variable Current Source>>

Figure 7:
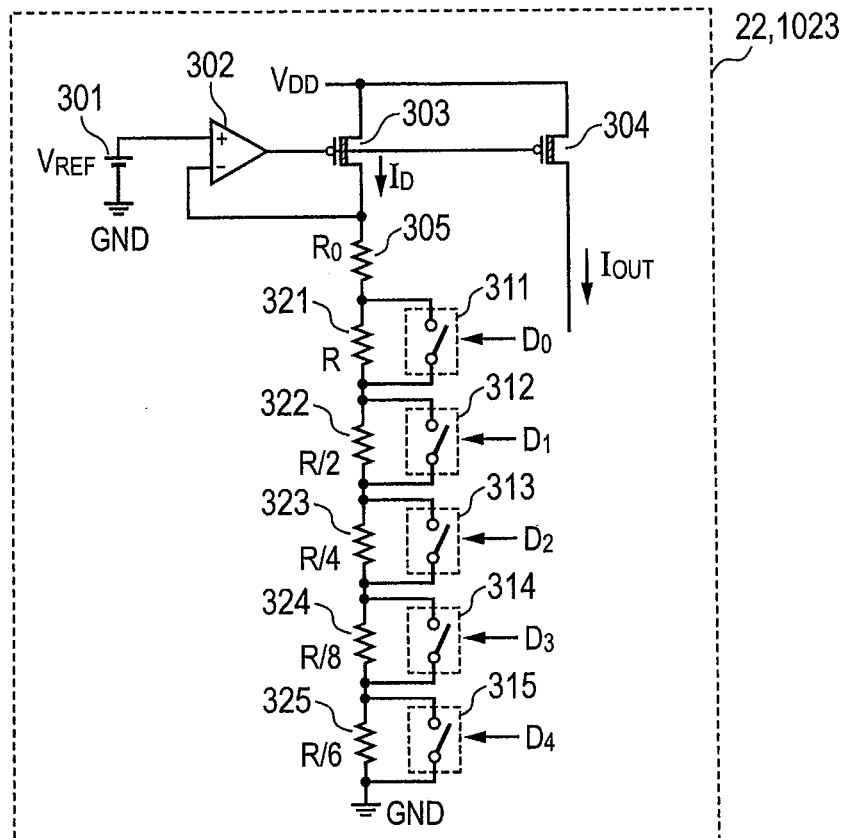
FIG. 7 is a drawing illustrating a configuration of a bias control unit 22 of the high-frequency power module 1 and a variable current source 1023 of the second element characteristic detector 102, according to Embodiment 1 of the present invention illustrated in FIG. 2.

FIG. 7 illustrates a configuration of the bias control unit 22 of the high-frequency power module 1 and the variable current source 1023 of the second element characteristic detector 102, according to Embodiment 1 of the present invention illustrated in FIG. 2.

As illustrated in FIG. 7, the bias control unit 22 and the variable current source 1023 include a reference voltage source 301, an operational amplifier 302, two P-channel MOS FETs 303 and 304, an adjusting resistor 305, plural control switches 311, 312, 313, 314, and 315, and plural resistors 321, 322, 323, 324, and 325. A reference voltage $V_{REF}$ of the reference voltage source 301 is supplied to a noninverting input terminal of the operational amplifier 302, an output signal of the operational amplifier 302 is supplied to gates of two P-channel MOS FETs 303 and 304, and the power supply voltage $V_{DD}$ is supplied to sources of two P-channel MOS FETs 303 and 304.

One end of the adjusting resistor 305 is coupled to a drain of the P-channel MOS FET 303 and an inverting input terminal of the operational amplifier 302, the other end of the adjusting resistor 305 is coupled to one end of the control switch 311 and one end of the resistor 321, and the other end of the control switch 311 and the other end of the resistor 321 are coupled to one end of the control switch 312 and one end of the resistor 322. The other end of the control switch 312 and the other end of the resistor 322 are coupled to one end of the control switch 313 and one end of the resistor 323, and the other end of the control switch 313 and the other end of the resistor 323 are coupled to one end of the control switch 314 and one end of the resistor 324. The other end of the control switch 314 and the other end of the resistor 324 are coupled to one end of the control switch 315 and one end of the resistor 325, and the other end of the control switch 315 and the other end of the resistor 325 are coupled to the ground voltage GND.

In particular, the resistor 321 is set to have a value of resistance R, the resistor 322 is set to have a value of resistance R/2, the resistor 323 is set to have a value of resistance R/4, the resistor 324 is set to have a value of resistance R/8, and the resistor 325 is set to have a value of resistance R/16.

A digital value $D_0$ of the most significant bit (MSB) of the digital error compensation value of the search control unit 104, which has responded the comparison output signal of the voltage comparator 103 of the process monitoring circuit 100, is supplied to the control switch 311. A digital value $D_1$ of the second bit of the digital error compensation value is supplied to the control switch 312, and a digital value $D_2$ of the third bit of the digital error compensation value is supplied to the control switch 313. A digital value $D_3$ of the fourth bit of the digital error compensation value is supplied to the control switch 314, and a digital value $D_4$ of the least significant bit (LSB) of the digital error compensation value of the search control unit 104 is supplied to the control switch 315. Therefore, a drain current $I_D$ of the P-channel MOS FET 303 is determined by the digital values $D_0$, $D_1$, $D_2$, $D_3$, and $D_4$ of the digital error compensation value of the search control unit 104, and an output current $I_{OUT1}$ proportional to the drain current $I_D$ of the P-channel MOS FET 303 flows through the P-channel MOS FET 304. The bias current of the bias control unit 22 and the bias current of the variable current source 1023 are determined by the output current $I_{OUT}$ of the P-channel MOS FET 304.

In cases where the bias control unit 22 and the variable current source 1023 are realized by the circuit illustrated in FIG. 7, it is also possible to omit the control data conversion table 106 by making mutually different the values of resistance of the resistors 321, 322, 323, 324, and 325, in the variable current circuit which realize the bias control unit 22, and the variable current circuit which realizes the variable current source 1023.

<<Determination of a Digital Error Compensation Value, and Convergence of a Difference Voltage>>

Figure 8:
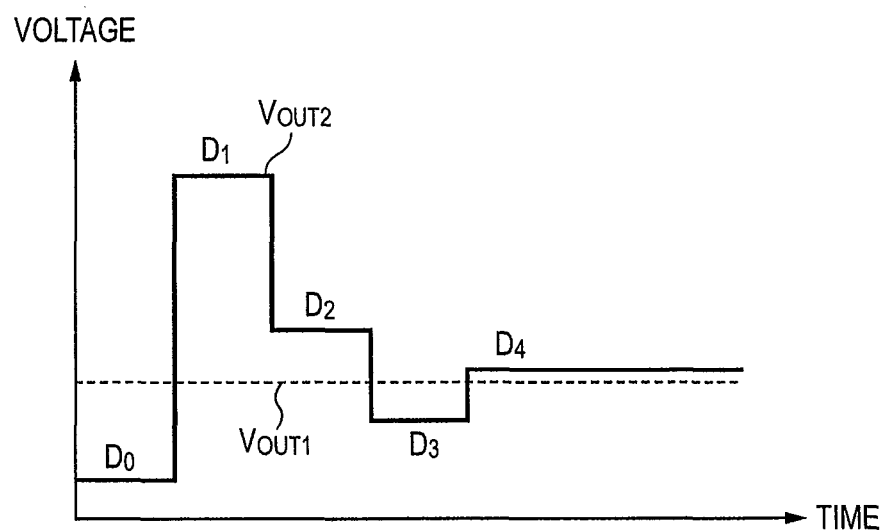
FIG. 8 is a drawing illustrating a manner in which digital values $D_0$, $D_1$, $D_2$, $D_3$, and $D_4$ of a digital error compensation value are determined by binary search, performed by the search control unit 104 of the calibration circuit 10 of the high-frequency power module 1, according to Embodiment 1 of the present invention illustrated in FIG. 2, and in which a difference voltage of the first detection voltage $V_{OUT1}$ of the first element characteristic detector 101 and the second detection voltage $V_{OUT2}$ of the second element characteristic detector 102 converges to a minimum state.

FIG. 8 illustrates a manner in which digital values $D_0$, $D_1$, $D_2$, $D_3$, and $D_4$ of the digital error compensation value are determined by binary search performed by the search control unit 104 of the calibration circuit 10 of the high-frequency power module 1, according to Embodiment 1 of the present invention illustrated in FIG. 2, and in which a difference voltage of the first detection voltage $V_{OUT1}$ of the first element characteristic detector 101 and the second detection voltage $V_{OUT2}$ of the second element characteristic detector 102 converges to a minimum state.

Immediately after starting the calibration operation of the calibration circuit 10 illustrated in FIG. 8, the search control unit 104 controls the digital value $D_0$, $D_1$, $D_2$, $D_3$, and $D_4$ of the digital error compensation value to "10000", and only the control switch 311 is controlled to OFF state and other control switches 312, 313, 314, and 315 are all controlled to ON state. Consequently, the variable resistance is set as the value of resistance R of the resistor 321 by the control switches 311, 312, 313, 314, and 315.

Immediately after the start of the calibration operation, the first detection voltage $V_{OUT1}$ of the first element characteristic detector 101 and the second detection voltage $V_{OUT2}$ of the second element characteristic detector 102 are different due to variations of the semiconductor manufacturing process. In the first voltage comparison in the voltage comparator 103 for determining the digital value $D_0$ of the most significant bit of the digital error compensation value, the second detection voltage $V_{OUT2}$ is lower than the first detection voltage $V_{OUT1}$. Consequently, the search control unit 104 changes the digital value $D_0$ of the most significant bit of the digital error compensation value from a high level "1" to a low level "0", and changes the digital value $D_1$ of the second bit of the digital error compensation value from a low level "0" to a high level "1."

Therefore, in advance of the second voltage comparison in the voltage comparator 103 for determining the digital value $D_1$ of the second bit of the digital error compensation value, the control switch 311 is changed to ON state from OFF state and the control switch 312 is changed to OFF state from ON state, and the variable resistance by the control switches 311-315 is changed to the value of resistance R/2 of the resistor 322. Consequently, the drain current $I_D$ of the P-channel MOS FET 303 and the output current $I_{OUT}$ of the P-channel MOS FET 304 increase. Therefore, the bias current of the variable current source 1023 increases, and the second detection voltage $V_{OUT2}$ of the second element characteristic detector 102 increases.

In the second voltage comparison in the voltage comparator 103 for determining the digital value $D_1$ of the second bit of the digital error compensation value, the second detection voltage $V_{OUT2}$ is higher than the first detection voltage $V_{OUT1}$. Consequently, the search control unit 104 maintains the digital value $D_1$ of the second bit of the digital error compensation value to a high level "1", and changes the digital value $D_2$ of the third bit of the digital error compensation value from a low level "0" to a high level "1."

Therefore, in advance of the third voltage comparison in the voltage comparator 103 for determining the digital value $D_2$ of the third bit of the digital error compensation value, the control switch 312 is maintained to OFF state, the control switch 313 is changed from ON state to OFF state, and the variable resistance by the control switches 311-315 is changed to the added resistance of a value of resistance R/2 of the resistor 322 and a value of resistance R/4 of the resistor 323. Consequently, the drain current $I_D$ of the P-channel MOS FET 303 and the output current $I_{OUT}$ of the P-channel MOS FET 304 decrease. Therefore, the bias current of the variable current source 1023 decreases, and the second detection voltage $V_{OUT2}$ of the second element characteristic detector 102 decreases.

In the third voltage comparison in the voltage comparator 103 for determining the digital value $D_2$ of the third bit of the digital error compensation value, the second detection voltage $V_{OUT2}$ is higher than the first detection voltage $V_{OUT1}$. Consequently, the search control unit 104 maintains the digital value $D_1$ of the second bit of the digital error compensation value to a high level "1", maintains the digital value $D_2$ of the third bit of the digital error compensation value to a high level "1", and changes the digital value $D_3$ of the fourth bit of the digital error compensation value from a low level "0" to a high level "1."

Therefore, in advance of the fourth voltage comparison in the voltage comparator 103 for determining the digital value $D_3$ of the fourth bit of the digital error compensation value, the control switch 313 is maintained to OFF state, the control switch 314 is changed from ON state to OFF state, and the variable resistance by the control switches 311-315 is changed to the added resistance of a value of resistance R/2 of the resistor 322, a value of resistance R/4 of the resistor 323, and a value of resistance R/8 of the resistor 324. Consequently, the drain current $I_D$ of the P-channel MOS FET 303 and the output current $I_{OUT}$ of the P-channel MOS FET 304 decrease. Therefore, the bias current of the variable current source 1023 decreases, and the second detection voltage $V_{OUT2}$ of the second element characteristic detector 102 decreases.

In the fourth voltage comparison in the voltage comparator 103 for determining the digital value $D_3$ of the fourth bit of the digital error compensation value, the second detection voltage $V_{OUT2}$ is lower than the first detection voltage $V_{OUT1}$. Consequently, the search control unit 104 maintains the digital value $D_2$ of the third bit of the digital error compensation value to a high level "1", changes the digital value $D_3$ of the fourth bit of the digital error compensation value from a high level "1" to a low level "0", and changes the digital value $D_4$ of the fifth bit of the digital error compensation value from a low level "0" to a high level "1."

Therefore, in advance of the last and fifth voltage comparison in the voltage comparator 103 for determining the digital value $D_4$ of the least significant bit of the digital error compensation value, the control switch 314 is changed from OFF state to ON state, the control switch 315 is changed from ON state to OFF state, and the variable resistance by the control switches 311-315 is changed to the added resistance of a value of resistance R/2 of the resistor 322, a value of resistance R/4 of the resistor 323, and a value of resistance R/16 of the resistor 325. Consequently, the drain current $I_D$ of the P-channel MOS FET 303 and the output current $I_{OUT}$ of the P-channel MOS FET 304 increase. Therefore, the bias current of the variable current source 1023 increases, and the second detection voltage $V_{OUT2}$ of the second element characteristic detector 102 increases.

In the last and fifth voltage comparison in the voltage comparator 103 for determining the digital value $D_4$ of the least significant bit of the digital error compensation value, the second detection voltage $V_{OUT2}$ is higher than the first detection voltage $V_{OUT1}$. Consequently, the search control unit 104 maintains the digital value $D_3$ of the fourth bit of the digital error compensation value to a low level "0", and maintains the digital value $D_4$ of the least significant bit of the digital error compensation value to a high level "1."

<<The Clock Generating Unit for Calibration Operation>>

Figure 9:
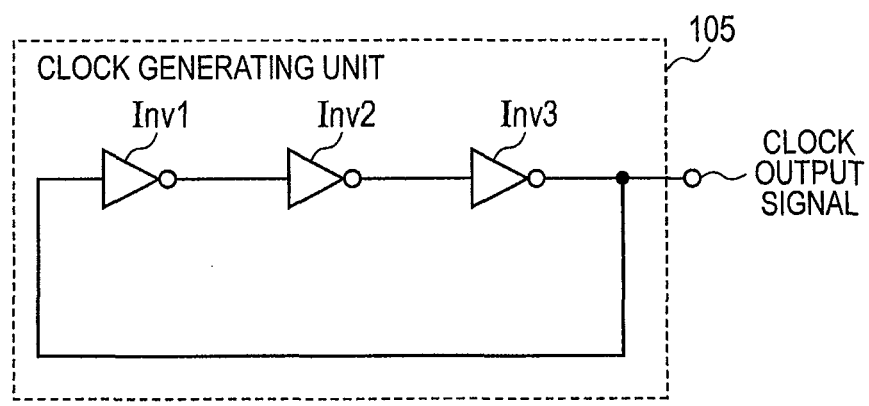
FIG. 9 is a drawing illustrating a configuration of a clock generating unit 105 for generating an operation clock of the search control unit 104 of the calibration circuit 10 of the high-frequency power module 1, according to Embodiment 1 of the present invention illustrated in FIG. 2.

FIG. 9 illustrates a configuration of the clock generating unit 105 for generating an operation clock of the search control unit 104 of the calibration circuit 10 of the high-frequency power module 1, according to Embodiment 1 of the present invention illustrated in FIG. 2.

As illustrated in FIG. 9, the clock generating unit 105, which generates the search control operation clock of the search control unit 104 of the calibration circuit 10 illustrated in FIG. 2, is comprised of three-stage series-coupled inverters Inv1, Inv2, and Inv3. An input terminal of the first-stage inverter Inv1 is coupled to an output terminal of the final-stage inverter Inv3, an output terminal of the first-stage inverter Inv1 is coupled to an input terminal of the intermediate-stage inverter Inv2, and an output terminal of the intermediate-stage inverter Inv2 is coupled to an input terminal of the final-stage inverter Inv3. The clock output signal is generated from the output terminal of the final-stage inverter Inv3.

Each inverter of the three-stage series-coupled inverters Inv1, Inv2, and Inv3 of the clock generating unit 105 illustrated in FIG. 9 can be comprised of a CMOS inverter including a P-channel MOS FET and an N-channel MOS FET. It is possible to form the CMOS inverter concurrently by the CMOS semiconductor manufacturing process which forms the P-channel MOS FETs 10161, 10162, 10261, and 10262, and the N-channel MOS FETs 1014, 1015, 1024, 1025, 211, and 212 illustrated in FIG. 2.

FIG. 10 illustrates a manner in which the clock generating unit 105 is formed in a CMOS silicon semiconductor chip "Chip" with a high-frequency power amplifier circuit 20 and the calibration circuit 10, the clock generating unit 105 being comprised of the ring oscillator of three-stage series-coupled CMOS inverters Inv1, Inv2, and Inv3, according to Embodiment 1 of the present invention illustrated in FIG. 9.

As illustrated in FIG. 10, the high-frequency power module 1 according to Embodiment 1 of the present invention mounts the CMOS silicon semiconductor chip "Chip" including the high-frequency power amplifier circuit 20, the calibration circuit 10, and the clock generating unit 105, and mounts, on the same module, an input matching circuit 108 and the output matching circuit 109 which are coupled to an RF signal input terminal and an RF signal output terminal of the high-frequency power amplifier circuit 20, respectively.

FIG. 11 illustrates another example of a high-frequency power module 1 according to Embodiment 1 of the present invention, in which a clock generating unit 105 comprised of a crystal oscillator, a CMOS silicon semiconductor chip "Chip", an input matching circuit 108, and an output matching circuit 109 are mounted in a common module.

As illustrated in FIG. 11, the high-frequency power amplifier circuit 20 and the calibration circuit 10 are formed in the CMOS silicon semiconductor chip "Chip."

Embodiment 2

FIG. 12 illustrates a configuration of a high-frequency power module 1 according to Embodiment 2 of the present invention.

The high-frequency power module 1 according to Embodiment 2 of the present invention illustrated in FIG. 12 is different from the high-frequency power module 1 according to Embodiment 1 of the present invention illustrated in FIG. 1 in the following point.

That is, the high-frequency power module 1 according to Embodiment 2 of the present invention illustrated in FIG. 12 further comprises a power-on detection circuit 110; a power management circuit 111; a gain control circuit 112; and a gain-control-oriented variable current source 113. The gain control circuit 112 controls the gain-control-oriented variable current source 113 so that the variable current substantially proportional to an automatic power control voltage Vapc flows through the gain-control-oriented variable current source 113. Consequently, the amplification gain of the amplifier unit 21 is rendered proportional to the automatic power control voltage Vapc substantially.

An external power supply voltage $V_{DD}$ is supplied to the power-on detection circuit 110 and the power management circuit 111 from the exterior of the high-frequency power module 1, for example from a battery of the wireless communication terminal, such as a mobile-phone. Therefore, the power-on detection circuit 110 can detect the power-on by a rise of the voltage level of the external power supply voltage $V_{DD}$.

FIG. 13 is a waveform chart illustrating operation of the high-frequency power module 1, according to Embodiment 2 of the present invention illustrated in FIG. 12.

As illustrated in FIG. 13, when the rise of the voltage level of the external power supply voltage $V_{DD}$ is started by the power-on, the power-on detection circuit 110 supplies a power-on reset signal Pon_Reset to the power management circuit 111.

In response to the power-on reset signal Pon_Reset, the power management circuit 111 generates a calibration-operation power supply voltage $V_{DD}$_CAL, and supplies it to the first element characteristic detector 101, the second element characteristic detector 102, and the voltage comparator 103 of the process monitoring circuit 100 of the calibration circuit 10, and to the search control unit 104, the clock generating unit 105, the control data conversion table 106, and the control data holding unit 107.

An operation clock signal CLK to be supplied to the search control unit 104 of the calibration circuit 10 is generated from the clock generating unit 105 by supply of the calibration-operation power supply voltage $V_{DD}$_CAL to the clock generating unit 105. At the timing when the oscillating frequency of the operation clock signal CLK is approximately stabilized, a calibration operation start signal CAL_Start is generated by the power-on detection circuit 110 and supplied to the search control unit 104.

In response to the operation clock signal CLK and the calibration operation start signal CAL_Start, the search control unit 104 calculates successively the digital values $D_0$, $D_1$, $D_2$, $D_3$, and $D_4$ of the digital error compensation value which minimizes the difference between the first detected output signal of the first element characteristic detector 101 and the second detected output signal of the second element characteristic detector 102, according to an appropriate search algorithm, such as a binary search, for example.

According to the digital values $D_0$, $D_1$, $D_2$, $D_3$, and $D_4$ of the digital error compensation value of the search control unit 104 calculated in this way, the bias current of the bias control unit 22 and the variable constant current of the variable current source 1023 in the second element characteristic detector 102 are determined.

At the timing when the calculation operation of the digital values $D_0$, $D_1$, $D_2$, $D_3$, and $D_4$ of the digital error compensation value of the search control unit 104 has completed (that is, at the timing of completing the generation of the digital value $D_4$ of the least significant bit LSB of the digital error compensation value), a calibration operation end signal CAL_End is generated by the search control unit 104 and supplied to the power management circuit 111.

In response to the calibration operation end signal CAL_End, the power management circuit 111 sets the voltage level of the calibration-operation power supply voltage $V_{DD}$_CAL to approximately zero. As a result, it is possible to reduce the power consumption of the first element characteristic detector 101, the second element characteristic detector 102, the voltage comparator 103, the search control unit 104, the clock generating unit 105, and the control data conversion table 106.

In response to the calibration operation end signal CAL_End, the power management circuit 111 generates an RF-operation power supply voltage $V_{DD}$_RF, and supplies it to the amplifier unit 21, the bias control unit 22, the gain control circuit 112, and the gain-control-oriented variable current source 113. As a result, the amplifier unit 21, the bias control unit 22, the gain control circuit 112, the gain-control-oriented variable current source 113, and the control data holding unit 107 are activated to an operating state by the RF-operation power supply voltage $V_{DD}$_RF. Therefore, in the amplifier unit 21 and the bias control unit 22 of the high-frequency power amplifier circuit 20, the compensation operation dealing with variations of the semiconductor manufacturing process is executed by the digital feedback control.

Before generating the calibration operation end signal CAL_End, the voltage level of the RF-operation power supply voltage $V_{DD}$_RF is set to approximately zero. As a result, it is possible to reduce the power consumption of the amplifier unit 21, the bias control unit 22, the gain control circuit 112, and the gain-control-oriented variable current source 113.

Embodiment 3

FIG. 14 is a drawing illustrating a configuration of a first element characteristic detector 101 and a second element characteristic detector 102 of a process monitoring circuit 100 of a calibration circuit 10 and a configuration of an amplifier unit 21, according to Embodiment 3 of the present invention.

The calibration circuit 10 and the amplifier unit 21 according to Embodiment 3 of the present invention illustrated in FIG. 14 are different from the calibration circuit 10 and the amplifier unit 21 according to the Embodiment 1 of the present invention illustrated in FIG. 2 in the following point.

That is, the N-channel MOS FETs 1014, 1015, 1024, 1025, 211, and 212 included in the calibration circuit 10 and the amplifier unit 21 according to the Embodiment 1 of the present invention illustrated in FIG. 2 are replaced by silicon NPN bipolar transistors 1014, 1015, 1024, 1025, 211, and 212 included in the calibration circuit 10 and the amplifier unit 21 according to Embodiment 3 of the present invention illustrated in FIG. 14.

Therefore, BiCMOS semiconductor manufacturing process is applied in Embodiment 3 of the present invention illustrated in FIG. 14. That is, the silicon NPN bipolar transistors 1014, 1015, 1024, 1025, 211, and 212 are formed by the bipolar process of the BiCMOS semiconductor manufacturing process. The P-channel MOS FETs 10161, 10162, 10261, and 10262 and the three-stage series-coupled CMOS inverters of the clock generating unit 105 are formed by the CMOS process of the BiCMOS semiconductor manufacturing process. In a preferred embodiment, the silicon NPN bipolar transistors may be heterojunction bipolar transistors (HBT) of which the base region is silicon-germanium with a smaller band gap than that of silicon in the emitter region.

On the other hand, Embodiment 3 of the present invention illustrated in FIG. 14 is effectively applied also to cases where the base width Wb of a bipolar transistor varies due to variations of the bipolar process of the BiCMOS semiconductor manufacturing process and the effective base width varies by the Early effect. That is, even if the effective base width varies due to variations of the semiconductor manufacturing process, the feedback control is executed by the digital error compensation value of the search control unit 104, so as to minimize the difference between the first detected output signal of the first element characteristic detector 101 and the second detected output signal of the second element characteristic detector 102 in the monitoring circuit 100.

Also in cases where the base-emitter impurity concentration of a bipolar transistor varies, and hence the series resistance component of the base and the emitter varies due to variations of the bipolar process, with a resultant variation of the conductance, it is possible to apply the feedback control by the digital error compensation value according to Embodiment 3 of the present invention illustrated in FIG. 14.

As described above, the invention accomplished by the present inventors has been concretely explained based on various embodiments. However, it cannot be overemphasized that the present invention is not restricted to the embodiments, and it can be changed variously in the range which does not deviate from the gist.

For example, in Embodiment 3 of the present invention illustrated in FIG. 14, the bipolar transistors 1014, 1015, 1024, 1025, 211, and 212 may not necessarily be silicon transistors, but they may be heterojunction bipolar transistors (HBT) which use compound semiconductors, such as GaAs and InGaP. In this case, the compound semiconductor heterojunction bipolar transistors (HBT) 1014, 1015, 1024, 1025, 211, and 212 are integrated in a compound semiconductor chip, and the P-channel MOS FETs 10161, 10162, 10261, and 10262 and the three-stage series-coupled CMOS inverters of the clock generating unit 105, the operational amplifiers 1011 and 1021, and the voltage comparator 103 are integrated in a silicon semiconductor chip.

The MOS FETs 1014, 1015, 1024, 1025, 211, and 212 illustrated in FIG. 2 may be MOS FETs which use LDMOS process.

Furthermore, the configuration of the variable current source illustrated in FIG. 7 may be another configuration in which the resistors 321, 322, 323, 324, and 325 are coupled in parallel, respectively, and the switches 311, 312, 313, 314, and 315 are coupled between the resistors 321, 322, 323, 324, and 325 and the GND in series, respectively, and the other ends of the resistors 321, 322, 323, 324, and 325 are coupled to the adjusting resistor 305.

It is also possible that the search algorithm in the search control unit 104 can employ other algorithms, such as a linear search, in addition to the binary search.

The high-frequency power amplifier circuit according to the present invention is not restricted to the high-frequency power amplifier circuit which can be mounted in the transmitter of a mobile-phone terminal; however, it is needless to say that it can be adapted as a high-frequency power amplifier circuit which can be mounted in a wireless LAN communication terminal.

What is claimed is:

1. A high frequency circuit comprising:
   a high-frequency power amplifier circuit including an amplifier unit and a bias control unit;
   a process monitoring circuit;
   a search control unit; and
   a clock generating unit,
   wherein amplification gain of an amplification transistor configuring the amplifier unit of the high-frequency power amplifier circuit is controlled by a bias current of the amplification transistor set up by the bias control unit,
   wherein the process monitoring circuit comprises a first element characteristic detector, a second element characteristic detector, and a voltage comparator,
   wherein a first replica transistor of the first element characteristic detector, a second replica transistor of the second element characteristic detector, and the amplification transistor of the amplifier unit are formed by the same semiconductor manufacturing process,
   wherein the first element characteristic detector converts a first output current of the first replica transistor into a first detection voltage, wherein the second element characteristic detector converts a second output current of the second replica transistor into a second detection voltage,
   wherein the voltage comparator compares the first detection voltage with the second detection voltage, and supplies a comparison output signal to the search control unit,
   wherein, in response to a clock signal generated by the clock generating unit and to the comparison output signal of the voltage comparator, the search control unit generates a multi-bit digital error compensation value for minimizing a difference between the first detection voltage and the second detection voltage according to a predetermined search algorithm,
   wherein the second element characteristic detector and the bias control unit are feedback-controlled, in response to the digital error compensation value finally stored in the search control unit according to the predetermined search algorithm, wherein the first replica transistor is fixed such that a constant current flows through the first replica transistor, and wherein the second replica transistor is fixed such that a variable current which is feedback-controlled by the search control unit flows through the second replica transistor.

2. The high frequency circuit according to claim 1, wherein, in ideal conditions where variations of the semiconductor manufacturing process for forming the high-frequency power amplifier circuit can be substantially ignored, the first detection voltage of the first element characteristic detector and the second detection voltage of the second element characteristic detector are set at a substantially equal voltage level.

3. The high frequency circuit according to claim 2, wherein, in the ideal conditions, the second output current of the second replica transistor is set to be larger than the first output current of the first replica transistor, wherein the first element characteristic detector comprises a first current-to-voltage conversion resistor for converting the first output current of the first replica transistor into the first detection voltage, and the second element characteristic detector comprises a second current-to-voltage conversion resistor for converting the second output current of the second replica transistor into the second detection voltage, and wherein the first current-to-voltage conversion resistor is set to be larger than the second current-to-voltage conversion resistor, in order to set the first detection voltage and the second detection voltage to be at a substantially equal voltage level in the ideal conditions.

4. The high frequency circuit according to claim 3, wherein the first element characteristic detector comprises a first bias transistor coupled to the first replica transistor so as to configure a current mirror, and a first current source for passing a first current through the first bias transistor, wherein the second element characteristic detector comprises a second bias transistor coupled to the second replica transistor so as to configure a current mirror, and a second current source for passing a second current through the second bias transistor, wherein the amplifier unit comprises a third bias transistor coupled to the amplification transistor so as to configure a current mirror, wherein a third current flowing through the third bias transistor of the amplifier unit is set up by the bias control unit configured as a third current source, and wherein the value of the second current flowing through the second current source of the second element characteristic detector and the value of the third current flowing through the third current source of the amplifier unit are controlled, in response to the digital error compensation value finally stored in the search control unit.

5. The high frequency circuit according to claim 4, wherein the first element characteristic detector comprises a first reference voltage source; a first operational amplifier; and a first current mirror transistor pair comprised of a first input P-channel MOS FET and a first output P-channel MOS FET, wherein the second element characteristic detector comprises a second reference voltage source; a second operational amplifier; and a second current mirror transistor pair comprised of a second input P-channel MOS FET and a second output P-channel MOS FET, wherein a first reference voltage of the first reference voltage source is supplied to a noninverting input terminal of the first operational amplifier, wherein an output terminal of the first operational amplifier is coupled to a source of the first input P-channel MOS FET and a source of the first output P-channel MOS FET of the first current mirror transistor pair, wherein a gate of the first input P-channel MOS FET and a gate of the first output P-channel MOS FET are coupled with each other, wherein the gate of the first input P-channel MOS FET is coupled to a drain of the first input P-channel MOS FET, an output electrode of the first replica transistor, and an inverting input terminal of the first operational amplifier, wherein a drain of the first output P-channel MOS FET is coupled to the first current-to-voltage conversion resistor and one input terminal of the voltage comparator, wherein a second reference voltage of the second reference voltage source is supplied to a noninverting input terminal of the second operational amplifier, wherein an output terminal of the second operational amplifier is coupled to a source of the second input P-channel MOS FET and a source of the second output P-channel MOS FET of the second current mirror transistor pair, wherein a gate of the second input P-channel MOS FET and a gate of the second output P-channel MOS FET are coupled with each other, wherein the gate of the second input P-channel MOS FET is coupled to a drain of the second input P-channel MOS FET, an output electrode of the second replica transistor, and an inverting input terminal of the second operational amplifier, wherein the drain of the second output P-channel MOS FET is coupled to the second current-to-voltage conversion resistor and the other input terminal of the voltage comparator, and wherein the second reference voltage of the second reference voltage source is set to be larger than the first reference voltage of the first reference voltage source.

6. The high frequency circuit according to claim 5, wherein the first replica transistor, the second replica transistor, the amplification transistor, the first bias transistor, the second bias transistor, and the third bias transistor are N-channel MOS FETs each formed by the same semiconductor manufacturing process.

7. The high frequency circuit according to claim 5, wherein the first replica transistor, the second replica transistor, the amplification transistor, the first bias transistor, the second bias transistor, and the third bias transistor are bipolar transistors each formed by the same semiconductor manufacturing process.

8. The high frequency circuit according to claim 5, wherein the first replica transistor, the second replica transistor, the amplification transistor, the first bias transistor, the second bias transistor, and the third bias transistor are heterojunction bipolar transistors each formed in a compound semiconductor chip by the same semiconductor manufacturing process.

9. The high frequency circuit according to claim 5, wherein the high-frequency power amplifier circuit, the process monitoring circuit, the search control unit, and the clock generating unit are formed in a single semiconductor chip.

10. The high frequency circuit according to claim 5,
wherein the high-frequency power amplifier circuit, the process monitoring circuit, the search control unit, and the clock generating unit are mounted in a common high-frequency power module, and the high-frequency power amplifier circuit, the process monitoring circuit, and the search control unit are formed in a single semiconductor chip.

11. The high frequency circuit according to claim 5, further comprising:
a control circuit;
a power supply circuit; and
a control data holding unit,
wherein the control circuit and the power supply circuit are supplied with an external power supply voltage, and the control circuit supplies a control start signal to the power supply circuit,
wherein, in response to the control start signal, the power supply circuit supplies a calibration power supply voltage to the first element characteristic detector, the second element characteristic detector, and the voltage comparator of the process monitoring circuit, and to the search control unit and the clock generating unit,
wherein the first element characteristic detector, the second element characteristic detector, and the voltage comparator of the process monitoring circuit, and the search control unit and the clock generating unit execute calibration operation with the use of the calibration power supply voltage, and accordingly the digital error compensation value is stored finally in the search control unit according to the predetermined search algorithm,
wherein, at the timing when the digital error compensation value is finally stored in the search control unit and the execution of the calibration operation completes, the search control unit supplies a control end signal to the power supply circuit,
wherein, in response to the control end signal, the power supply circuit supplies a high-frequency amplification power supply voltage to the amplifier unit and the bias control unit, and
wherein the amplifier unit and the bias control unit execute high-frequency amplifying operation with the use of the high-frequency amplification power supply voltage, and in the period of the high-frequency amplifying operation, the calibration power supply voltage, which is supplied to the first element characteristic detector, the second element characteristic detector, and the voltage comparator of the process monitoring circuit, and to the search control unit and the clock generating unit, is set at a low voltage.

12. The high frequency circuit according to claim 11,
wherein, in the period of the calibration operation, the high-frequency amplification power supply voltage supplied to the amplifier unit and the bias control unit is set at a low voltage.

13. The high frequency circuit according to claim 12,
wherein the control circuit is configured as a power-on detection circuit operable to detect power-on of the external power supply voltage,
wherein the control circuit configured as the power-on detection circuit supplies the control start signal as a power-on reset signal to the power supply circuit, and
wherein, at the timing when the oscillating frequency of the clock signal generated by the clock generating unit is stabilized substantially after the start of supplying the calibration power supply voltage to the clock generating unit, the control circuit configured as the power-on detection circuit supplies a calibration start signal to the search control unit.

14. The high frequency circuit according to claim 13, further comprising:
a gain control circuit; and
a gain-control-oriented variable current source,
wherein the gain control circuit controls the gain-control-oriented variable current source so that the gain-control-oriented variable current substantially proportional to an automatic power control voltage flows through the gain-control-oriented variable current source,
wherein the gain-control-oriented variable current flowing through the gain-control-oriented variable current source is supplied to the amplifier unit, and
wherein the power supply circuit supplies the high-frequency amplification power supply voltage to the gain control circuit and the gain-control-oriented variable current source, in the period of the high-frequency amplifying operation.

15. A high frequency module comprising:
a high-frequency power amplifier circuit;
a process monitoring circuit;
a search control unit; and
a clock generating unit,
wherein the high-frequency power amplifier circuit comprises an amplifier unit and a bias control unit,
wherein amplification gain of an amplification transistor of the amplifier unit is controlled by a bias current of the amplification transistor set up by the bias control unit,
wherein the process monitoring circuit comprises a first replica transistor and a second replica transistor formed by the same semiconductor manufacturing process as the amplification transistor of the amplifier unit, and
wherein the process monitoring circuit generates a monitor output monitoring the characteristics of the second replica transistor relative to the first replica transistor,
wherein, in response to a calibration clock signal of the clock generating unit and to the monitor output of the process monitoring circuit, the search control unit generates a multi-bit digital compensation value for tuning up the amplification gain of the amplification transistor according to a predetermined search algorithm, and
wherein the process monitoring circuit and the bias control unit are feedback-controlled, in response to the digital compensation value stored in the search control unit according to the predetermined search algorithm, and
wherein the first replica transistor is fixed such that a constant current flows through the first replica transistor, and
wherein the second replica transistor is fixed such that a current which is feedback-controlled by the search control unit flows through the second replica transistor.

16. The high frequency module according to claim 15,
wherein the amplification transistor of the amplifier unit and the first and second replica transistors of the process monitoring circuit are N-channel MOS FETs formed by the same semiconductor manufacturing process.

17. The high frequency module according to claim 15,
wherein the amplification transistor of the amplifier unit and the first and second replica transistors of the process monitoring circuit are bipolar transistors formed by the same semiconductor manufacturing process.

18. The high frequency module according to claim 15,
wherein the high-frequency power amplifier circuit, the process monitoring circuit, the search control unit, and the clock generating unit are formed in a single semiconductor chip, and a calibration circuit is comprised of the process monitoring circuit, the search control unit, and the clock generating unit.

19. The high frequency module according to claim 15,
wherein the high-frequency power amplifier circuit, the process monitoring circuit, and the search control unit are formed in a single semiconductor chip, and
wherein a calibration circuit to which a clock signal is supplied from the clock generating unit is comprised of the process monitoring circuit and the search control unit.

20. The high frequency module according to claim 15, further comprising:
a control circuit;
a power supply circuit; and
a control data holding unit,
wherein the control circuit and the power supply circuit are supplied with an external power supply voltage, and the control circuit supplies a control start signal to the power supply circuit,
wherein, in response to the control start signal, the power supply circuit supplies a calibration power supply voltage to the process monitoring circuit, the search control unit, and the clock generating unit,
wherein the process monitoring circuit, the search control unit, and the clock generating unit execute calibration operation with the use of the calibration power supply voltage, and accordingly the digital compensation value is stored in the search control unit according to the predetermined search algorithm,
wherein, at the timing when the digital compensation value is finally stored in the search control unit and the execution of the calibration operation completes, the search control unit supplies a control end signal to the power supply circuit,
wherein, in response to the control end signal, the power supply circuit supplies a high-frequency amplification power supply voltage to the amplifier unit and the bias control unit,
wherein the amplifier unit and the bias control unit execute high-frequency amplifying operation using the high-frequency amplification power supply voltage, and
wherein in the period of the high-frequency amplifying operation, the calibration power supply voltage supplied to the process monitoring circuit, the search control unit, and the clock generating unit is set at a low voltage.

* * * * *